(12) United States Patent
Bok et al.

(10) Patent No.: US 11,928,298 B2
(45) Date of Patent: Mar. 12, 2024

(54) DISPLAY DEVICE

(71) Applicant: Samsung Display Co., Ltd., Yongin-Si (KR)

(72) Inventors: Seung-Lyong Bok, Hwaseong-si (KR); Chang Sik Kim, Seongnam-si (KR); Won-Ki Hong, Suwon-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/851,282

(22) Filed: Jun. 28, 2022

(65) Prior Publication Data
US 2023/0028191 A1 Jan. 26, 2023

(30) Foreign Application Priority Data
Jul. 26, 2021 (KR) .................. 10-2021-0097620

(51) Int. Cl.
*G06F 3/044* (2006.01)
*G06F 3/041* (2006.01)
*H01L 27/32* (2006.01)
*H10K 59/40* (2023.01)
*H10K 59/122* (2023.01)

(52) U.S. Cl.
CPC .......... *G06F 3/0445* (2019.05); *G06F 3/0412* (2013.01); *G06F 3/0446* (2019.05); *H10K 59/40* (2023.02); *G06F 2203/04102* (2013.01); *G06F 2203/04105* (2013.01); *G06F 2203/04112* (2013.01); *H10K 59/122* (2023.02)

(58) Field of Classification Search
CPC .... G06F 3/0445; G06F 3/0446; G06F 3/0412; G06F 2203/04112; G06F 2203/04102; G06F 2203/04105; H10K 59/40; H10K 59/122; H10K 59/12
See application file for complete search history.

(56) References Cited

U.S. PATENT DOCUMENTS

| | | |
|---|---|---|
| 8,796,702 B2 | 8/2014 | Kim et al. |
| 8,872,206 B2 | 10/2014 | Chung et al. |
| 9,436,215 B2 | 9/2016 | Viallet et al. |
| 10,042,495 B2 | 8/2018 | Yang et al. |
| 10,185,430 B2 | 1/2019 | Zhu et al. |
| 10,318,143 B2 | 6/2019 | Severac et al. |
| 10,635,212 B2 | 4/2020 | Hong et al. |

(Continued)

FOREIGN PATENT DOCUMENTS

| | | |
|---|---|---|
| KR | 10-2013-0107640 A | 10/2013 |
| KR | 10-2017-0025620 A | 3/2017 |

(Continued)

*Primary Examiner* — Deeprose Subedi
(74) *Attorney, Agent, or Firm* — Innovation Counsel LLP

(57) ABSTRACT

Disclosed is a display device including a display panel that displays an image on a display surface and an input sensor having a sensor area and a dummy area defined therein. The input sensor includes a first conductive layer that is disposed on the display panel and that includes a first dummy electrode disposed in the sensor area and the dummy area, a second conductive layer that is disposed on the first conductive layer and that includes a sensor electrode disposed in the sensor area and a second dummy electrode disposed in the dummy area, and a pressure sensor electrode disposed between the first dummy electrode and the second dummy electrode.

18 Claims, 23 Drawing Sheets

(56) References Cited

U.S. PATENT DOCUMENTS

| | | | |
|---|---|---|---|
| 2012/0104422 A1 | 5/2012 | Lee et al. | |
| 2013/0249860 A1 | 9/2013 | Seo et al. | |
| 2014/0145156 A1 | 5/2014 | Choi et al. | |
| 2017/0068368 A1* | 3/2017 | Hsiao | G06F 3/0445 |
| 2018/0356922 A1 | 12/2018 | Liu et al. | |
| 2019/0056829 A1* | 2/2019 | Ye | H10K 50/813 |
| 2020/0168689 A1* | 5/2020 | Park | G09G 3/3225 |
| 2020/0212116 A1 | 7/2020 | Kim et al. | |
| 2020/0319735 A1 | 10/2020 | Kim et al. | |
| 2021/0004105 A1 | 1/2021 | Afentakis | |
| 2022/0164060 A1* | 5/2022 | Yamamoto | G06F 3/0446 |

FOREIGN PATENT DOCUMENTS

| | | |
|---|---|---|
| KR | 10-2020-0082355 A | 7/2020 |
| KR | 10-2020-0117084 A | 10/2020 |

\* cited by examiner

DISPLAY DEVICE

CROSS-REFERENCE TO RELATED APPLICATIONS

This application claims priority under 35 U.S.C. § 119 to Korean Patent Application No. 10-2021-0097620 filed on Jul. 26, 2021, in the Korean Intellectual Property Office, the disclosures of which are incorporated by reference herein in their entireties.

BACKGROUND

Embodiments of the present disclosure described herein relate to a display device, and more particularly, relate to a display device including an input sensor and a pressure sensor.

A touch sensor, a kind of input device, is provided in a display device. A user may conveniently provide a desired input by pressing or touching the touch sensor while viewing an image displayed on a screen of the display device.

Demands for touch sensors capable of sensing not only the position where a touch input is generated but also the pressure caused by the touch input are increasing. If the position of a touch and the pressure of the touch are able to be sensed, a wider variety of functions may be provided to users.

SUMMARY

Embodiments of the present disclosure provide a display device for enabling accurate input by sensing a touch of a user based on pressure sensing.

According to an embodiment, a display device includes a display panel that displays an image on a display surface and an input sensor having a sensor area and a dummy area defined therein. The input sensor includes a first conductive layer that is disposed on the display panel and that includes a first dummy electrode disposed in the sensor area and the dummy area, a second conductive layer that is disposed on the first conductive layer and that includes a sensor electrode disposed in the sensor area and a second dummy electrode disposed in the dummy area, and a pressure sensor electrode disposed between the first dummy electrode and the second dummy electrode.

The display device may further include a window disposed on the input sensor, and the window may include a thin glass film having a thickness of 20 μm to 100 μm.

The display surface may include a plurality of input sections spaced apart from each other, and the pressure sensor electrode may overlap one of the plurality of input sections.

A non-input section may be disposed between input sections disposed adjacent to each other, and the pressure sensor electrode may not overlap the non-input section.

The sensor electrode may include a first sensing electrode extending in a first direction and a second sensing electrode extending in a second direction crossing the first direction, and the dummy area may be disposed between the first sensing electrode and the second sensing electrode in a plan view.

The first sensing electrode may include a plurality of first electrodes, and the second sensing electrode may include a plurality of second electrodes. Each of the plurality of first electrodes and each of the plurality of second electrodes includes an open area which is the dummy area.

The pressure sensor electrode may have a mesh structure.

The display device may further include an encapsulation layer disposed between the display panel and the input sensor, and the input sensor may include a first insulating layer disposed on the encapsulation layer, a second insulating layer disposed on the first insulating layer, and a third insulating layer disposed on the second insulating layer.

The first conductive layer may be disposed on the first insulating layer. The second conductive layer may be disposed on the second insulating layer. The pressure sensor electrode may be disposed between the first conductive layer and the second conductive layer.

The pressure sensor electrode may include a plurality of nano-particles.

According to an embodiment, a display device includes a base layer, a circuit layer disposed on the base layer, a display element layer disposed on the circuit layer, and a sensing layer that is disposed on the display element layer and that includes a sensing pattern. The display element layer includes a first electrode connected with the circuit layer, an emissive layer disposed on the first electrode, and a second electrode disposed on the emissive layer, and the second electrode has the same pattern as the sensing pattern.

The display device may further include an encapsulation layer disposed between the second electrode and the sensing pattern.

The display device may further include a pressure sensor layer disposed on the sensing layer, and the pressure sensor layer may include a first pressure sensing pattern and a second pressure sensing pattern disposed on the same layer as the sensing pattern.

The pressure sensor layer may further include a pressure sensor electrode disposed on the first pressure sensing pattern and the second pressure sensing pattern.

The display device may further include an input sensor, and the input sensor may include the sensing layer, the pressure sensor layer, and the second electrode.

The first pressure sensing pattern and the second pressure sensing pattern may be have an interdigitated configuration.

The display device may further include a window disposed on the sensing layer, and the window may include a thin glass film having a thickness of 20 μm to 100 μm.

According to an embodiment, a display device includes a base layer, a circuit layer disposed on the base layer, an emissive layer disposed on the circuit layer, a sensing layer disposed on the emissive layer, and a pressure sensor layer disposed on the sensing layer. The sensing layer includes a plurality of sensing electrodes, and the pressure sensor layer includes a first conductive layer and a second conductive layer disposed on the first conductive layer.

The first conductive layer may include a first electrode and a second electrode may have an interdigitated configuration, and the second conductive layer may include a pressure sensor electrode that covers the first electrode and the second electrode.

The first conductive layer may include a first electrode and a second electrode disposed on the first electrode, and the second conductive layer may include a pressure sensor electrode disposed between the first electrode and the second electrode.

BRIEF DESCRIPTION OF THE DRAWINGS

The above and other objects and features of the present disclosure will become apparent by describing in detail embodiments thereof with reference to the accompanying drawings.

DETAILED DESCRIPTION

Figure 1A:
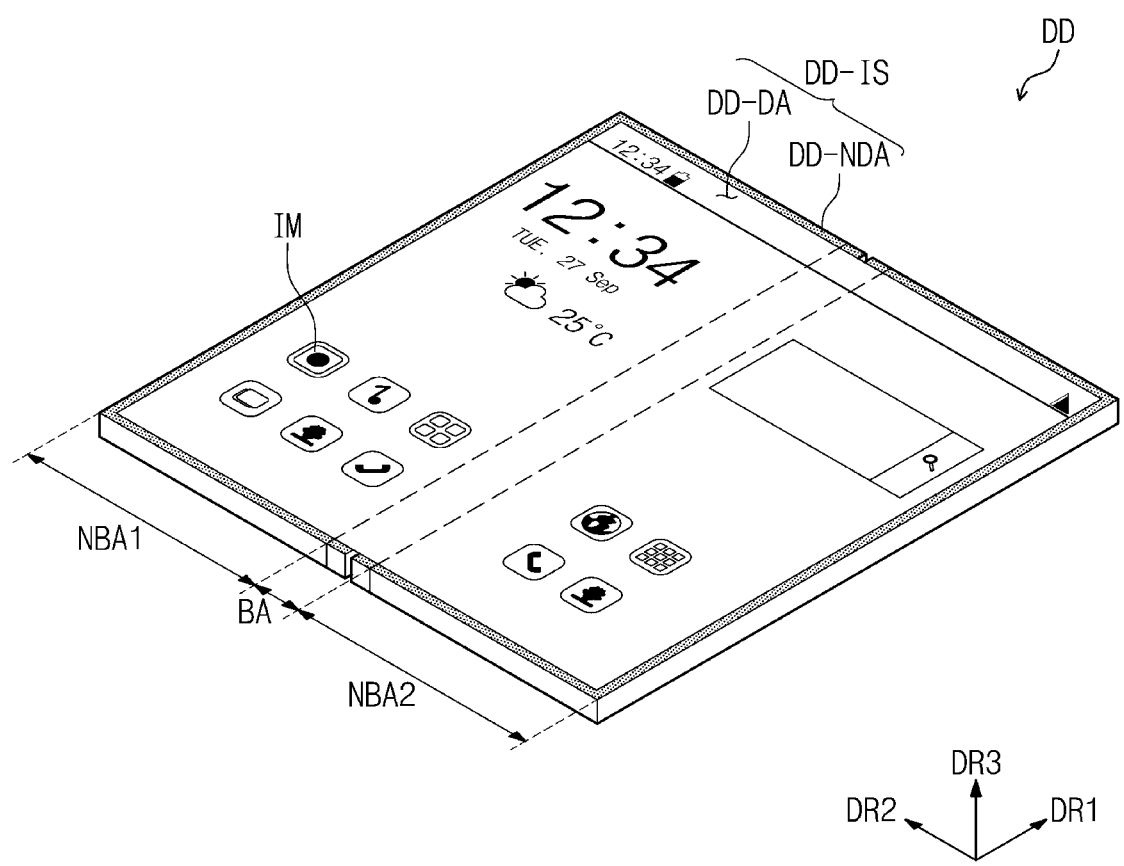
FIGS. 1A, 1B, 1C and 1D are perspective views of a display device according to an embodiment of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the present disclosure will be described with reference to the accompanying drawings.

FIGS. 1A to 1D are perspective views of a display device DD according to an embodiment of the present disclosure.

As illustrated in FIGS. 1A to 1D, a display surface DD-IS is parallel to a plane defined by a first directional axis DR1 and a second directional axis DR2. The normal direction of the display surface DD-IS, that is, the thickness direction of the display device DD, is indicated by a third directional axis DR3. Front surfaces (or, upper surfaces) and rear surfaces (or, lower surfaces) of elements may be distinguished from each other with respect to the third directional axis DR3. However, the directions indicated by the first to third directional axes DR1, DR2, and DR3 may be relative concepts and may be changed to different directions. Hereinafter, the first to third directions are the directions indicated by the first to third directional axes DR1, DR2, and DR3, respectively, and refer to the same reference numerals.

As illustrated in FIGS. 1A to 1D, the display surface DD-IS includes a display area DD-DA on which images IM are displayed and a non-display area DD-NDA adjacent to the display area DD-DA. The non-display area DD-NDA is an area where no image is displayed. In FIGS. 1A to 1D, icon images and a keyboard image are illustrated as examples of the images IM. For example, the display area DD-DA may have a quadrilateral shape. The non-display area DD-NDA may surround the display area DD-DA. However, without being limited thereto, the shape of the display area DD-DA and the shape of the non-display area DD-NDA may be relatively designed.

As illustrated in FIGS. 1A to 1D, the display device DD may include a plurality of areas defined depending on operation types. The display device DD may include a bending area BA that is bent with respect to a bending axis BX, and a first non-bending area NBA1 and a second non-bending area NBA2 that are not bent.

Figure 1B:
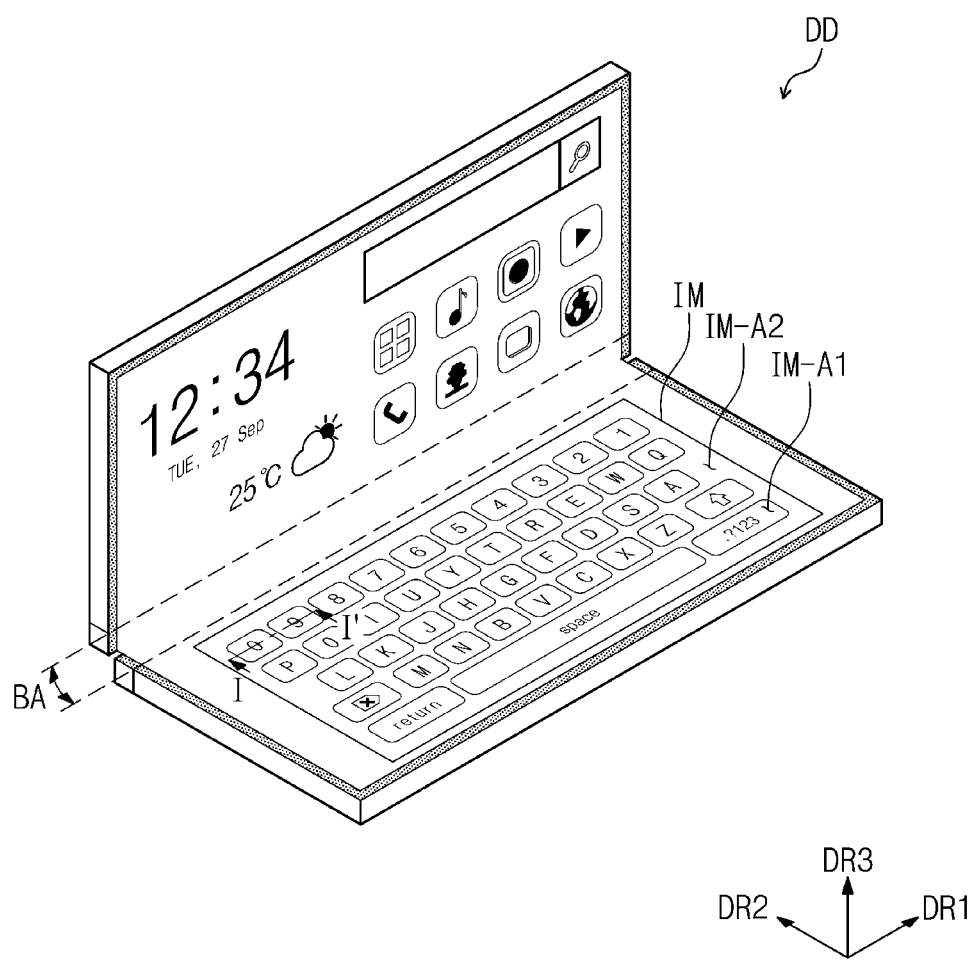

As illustrated in FIG. 1B, the display device DD may be folded with an angle of 90 degrees in the form of a notebook computer. In this case, an image IM displayed on the display surface DD-IS may include a keyboard image. An input section IM-A1 in which buttons are displayed and a non-input section IM-A2 in which no button is displayed may be defined in the keyboard image. The input section IM-A1 may include a plurality of buttons. The non-input section IM-A2 may be defined between the buttons of the input section IM-A1. Although not illustrated, the input section IM-A1 may include a touch pad. In this case, the non-input section IM-A2 may be defined in the remaining area other than the touch pad area.

The input section IM-A1 provides an input by a touch of a user and the non-input section IM-A2 does not provide an input despite the user's touch. To improve the accuracy of the user's touch on the input section IM-A1, an input sensor of the present disclosure includes a pressure sensing sensor. Detailed description thereabout will be given below.

Figure 1C:
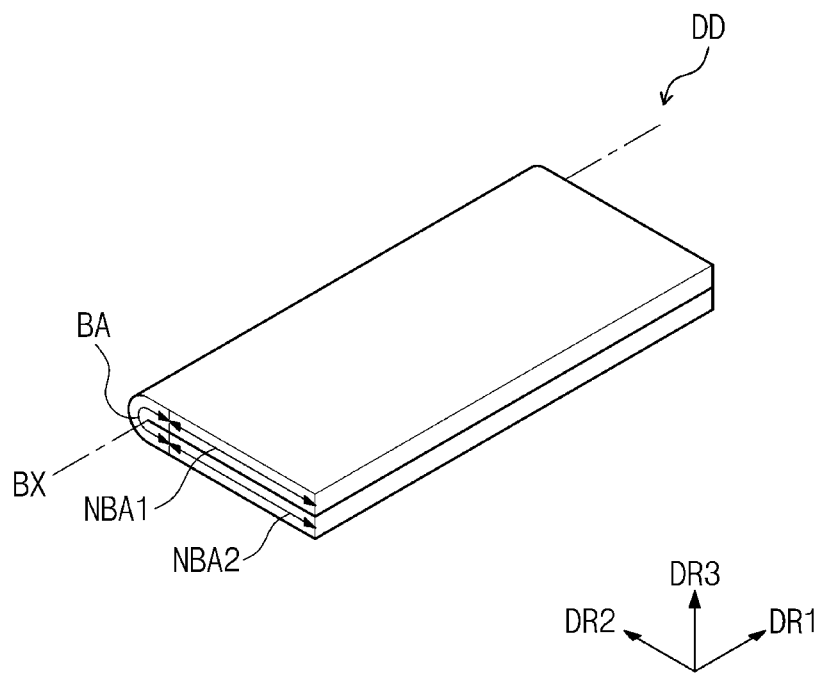
Figure 1D:
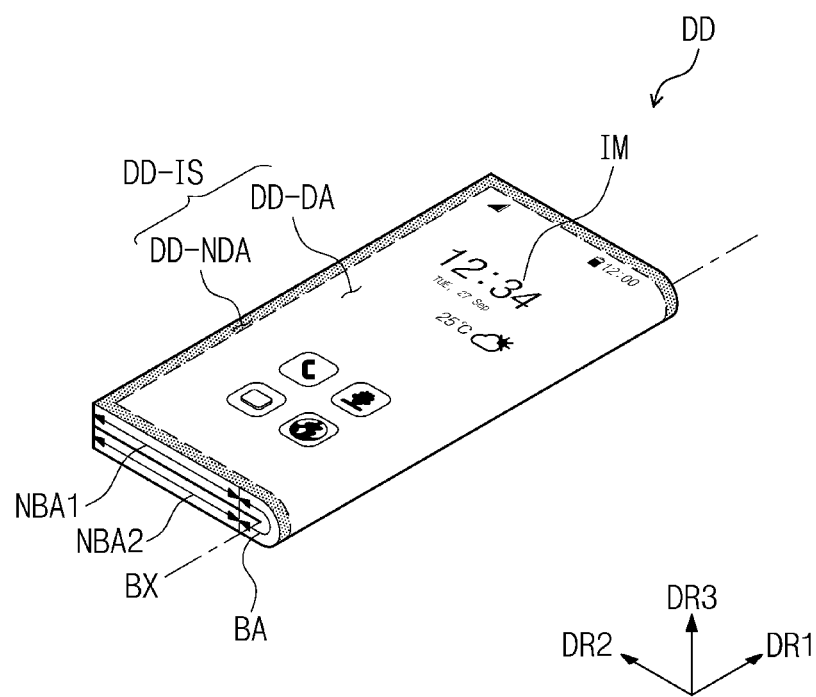

As illustrated in FIG. 1C, the display device DD may be bent inwardly such that the display surface DD-IS of the first non-bending area NBA1 and the display surface DD-IS of the second non-bending area NBA2 face each other. As illustrated in FIG. 1D, the display device DD may be bent outwardly such that the display surface DD-IS is exposed to the outside. A display module that is repeatedly bent and unbent as illustrated in FIGS. 1A to 1D may be defined as a foldable display module.

In an embodiment of the present disclosure, the display device DD may include a plurality of bending areas BA. In addition, the bending area BA may be defined to correspond to the form in which the user manipulates the display device DD. For example, unlike that illustrated in FIGS. 1B and 1C, the bending area BA may be defined parallel to the second directional axis DR2, or may be defined in a diagonal direction. The area of the bending area BA may be determined depending on a radius of curvature when the display device DD is bent. In an embodiment of the present disclosure, the display device DD repeating only the operating modes illustrated in FIGS. 1A and 1B will be described.

In an embodiment of the present disclosure, the foldable display device DD is illustrated. However, the present disclosure is not limited thereto. The display device DD may include a curved display surface or a three-dimensional display surface (a polygonal prismatic display surface) including a plurality of display areas facing different directions. Alternatively, in an embodiment of the present disclosure, the display device DD may be a flat rigid display module. In another case, the display device DD may be a bending type display module in which an edge area is bent.

In this embodiment, the display device DD applied to a mobile phone is illustrated. However, the present disclosure is not limited thereto. In an embodiment of the present disclosure, the display device DD may be applied to small and medium-sized electronic devices, such as a tablet computer, a car navigation system, a game machine, a smart watch, and the like, as well as large electronic devices such as a television, a monitor, and the like.

FIGS. 2A to 2D are sectional views of the display device DD according to an embodiment of the present disclosure. FIGS. 2A to 2D illustrate sections defined by the second directional axis DR2 and the third directional axis DR3. To describe the stacking relationship of a functional panel and/or functional units constituting the display device DD, the display device DD of FIGS. 2A to 2D is illustrated to be simple.

The display device DD according to an embodiment of the present disclosure may include a display panel, an input sensor, an anti-reflection unit, and a window. At least some of the display panel, the input sensor, the anti-reflection unit, and the window may be formed by a continuous process, or may be coupled together through adhesive members. In FIGS. 2A to 2D, pressure sensitive adhesive (PSA) films are illustrated as the adhesive members. The adhesive members to be described below may include a conventional adhesive or sticky substance and are not particularly limited. In an embodiment of the present disclosure, the anti-reflection unit may be replaced with another component, or may be omitted.

Depending on a presence or absence of a base layer, the input sensor ISP, the anti-reflection unit, and the window may be referred to as the input sensing panel ISP, the anti-reflection panel RPP, and the window panel WP, respectively, or may be referred to as the input sensing layer ISL, the anti-reflection layer RPL, and the window layer WL, respectively.

Figure 2A:
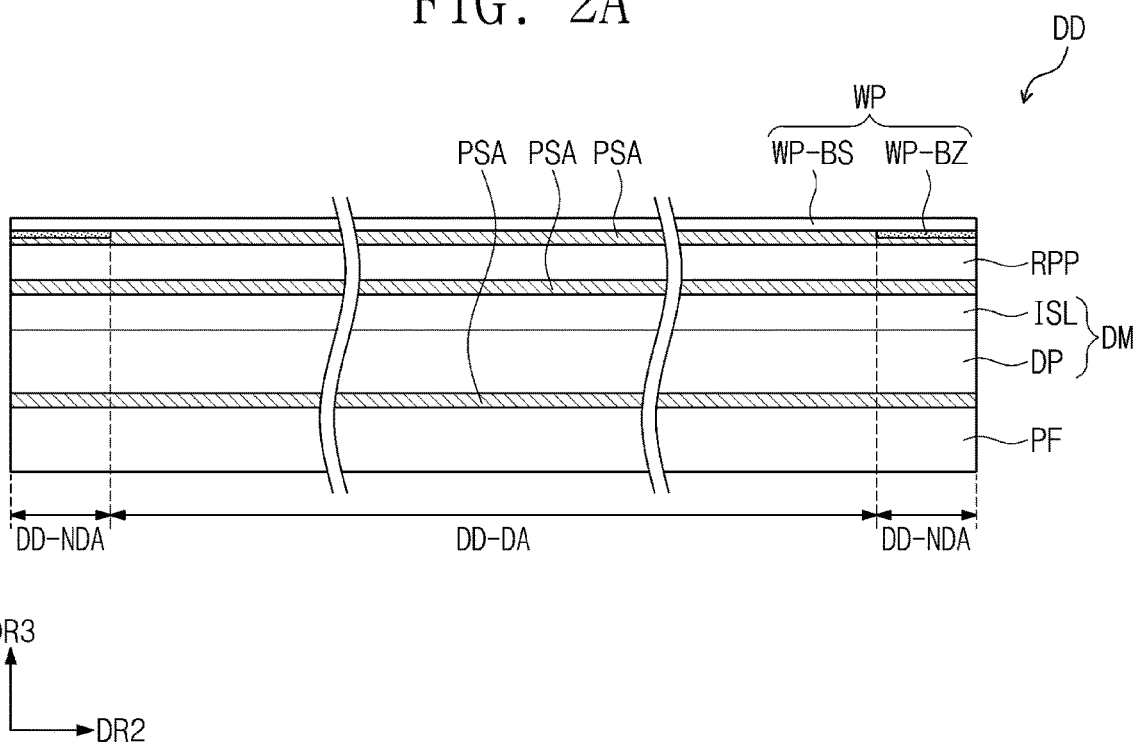
FIGS. 2A, 2B, 2C and 2D are sectional views of the display device according to an embodiment of the present disclosure.

As illustrated in FIG. 2A, the display device DD may include the display panel DP, the input sensing layer ISL, the anti-reflection panel RPP, the window panel WP, and a protective panel PF. The input sensing layer ISL is directly disposed on the display panel DP. The expression "a component B1 is directly disposed on a component A1" used herein means that an adhesive member is not disposed between the component A1 and the component B1. The component B1 is formed, through a continuous process, directly on a base surface provided by the component A1 after the component A1 is formed.

The display panel DP and the input sensing layer ISL directly disposed on the display panel DP may be defined as the display module DM. A pressure sensitive adhesive (PSA) film is disposed between the anti-reflection panel RPP and the window panel WP, between the display module DM and the anti-reflection panel RPP, and between the protective panel PF and the display module DM.

The display panel DP may display an image on the display surface. The display panel DP generates an image, and the input sensing layer ISP obtains coordinate information of an external input (e.g., a touch event). The protective panel PF supports the display panel DP and protects the display panel DP from an external impact.

The protective panel PF may include a plastic film as a base layer. The protective panel PF may include a plastic film containing one material selected from the group consisting of polyethyeleneterepthalate (PET), polyethyelene (PE), polyvinylchloride (PVC), polypropylene (PP), polystyrene (PS), polyacrylonitrile (PAN), styrene-acrylonitrile copolymer (SAN), acrylonitrile-butadiene-styrene (ABS), polymethyl methacrylate (PMMA), and combinations thereof. In particular, polyethyeleneterepthalate (PET) has excellent thermal resistance, fatigue strength, and electrical characteristics and is less affected by temperature and humidity.

The material of the protective panel PF is not limited to plastic resins and may include organic/inorganic composite materials. The protective panel PF may include a porous organic layer and an inorganic material filling pores of the organic layer.

The display panel DP according to an embodiment of the present disclosure may be a self-emissive display panel and is not particularly limited. For example, the display panel DP may be an organic light emitting display panel or a quantum dot light emitting display panel. An emissive layer of the organic light emitting display panel may contain an organic light emitting material. An emissive layer of the quantum dot light emitting display panel may contain quantum dots, quantum rods, and the like. Hereinafter, the display panel DP will be described as an organic light emitting display panel.

The anti-reflection panel RPP decreases the reflectivity of external light (or, sunlight) incident from above the window panel WP. The anti-reflection panel RPP according to an embodiment of the present disclosure may include a phase retarder and a polarizer. The phase retarder may be of a film type or a liquid-crystal coating type and may include a λ2 phase retarder and/or a λ4 phase retarder. The polarizer may also be of a film type or a liquid-crystal coating type. The film type polarizer may include a stretchable synthetic resin film, and the liquid-crystal coating type polarizer may include liquid crystals arranged in a predetermined arrangement. The phase retarder and the polarizer may further include a protective film. The phase retarder and the polarizer themselves or the protective film may be a base layer of the anti-reflection panel RPP.

The anti-reflection panel RPP according to an embodiment of the present disclosure may include color filters. The color filters have a predetermined arrangement. The arrangement of the color filters may be determined in consideration of emission colors of pixels included in the display panel DP. The anti-reflection panel RPP may further include a black matrix disposed adjacent to the color filters.

The window panel WP according to an embodiment of the present disclosure includes a base layer WP-BS and a light blocking pattern WP-BZ. The base layer WP-BS may include a glass substrate and/or a synthetic resin film. The base layer WP-BS is not limited to a single layer. The base layer WP-BS may include two or more films coupled by an adhesive member.

The light blocking pattern WP-BZ partially overlaps the base layer WP-BS. The light blocking pattern WP-BZ may be disposed on the rear surface of the base layer WP-BS and may define a bezel area of the display device DD, that is, the non-display area DD-NDA (refer to FIG. 1).

The light blocking pattern WP-BZ may be a colored organic film and may be formed by, for example, a coating method. Although not separately illustrated, the window panel WP may further include a functional coating layer disposed on the front surface of the base layer WP-BS. The functional coating layer may include an anti-fingerprint layer, an anti-reflection layer, and a hard coating layer.

Figure 2B:
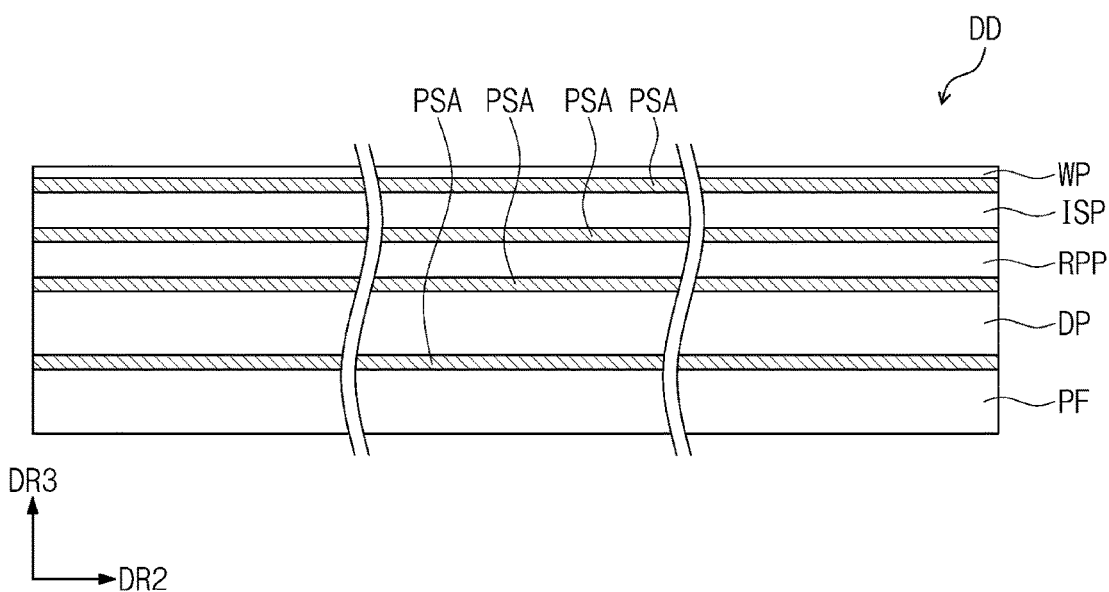
Figure 2C:
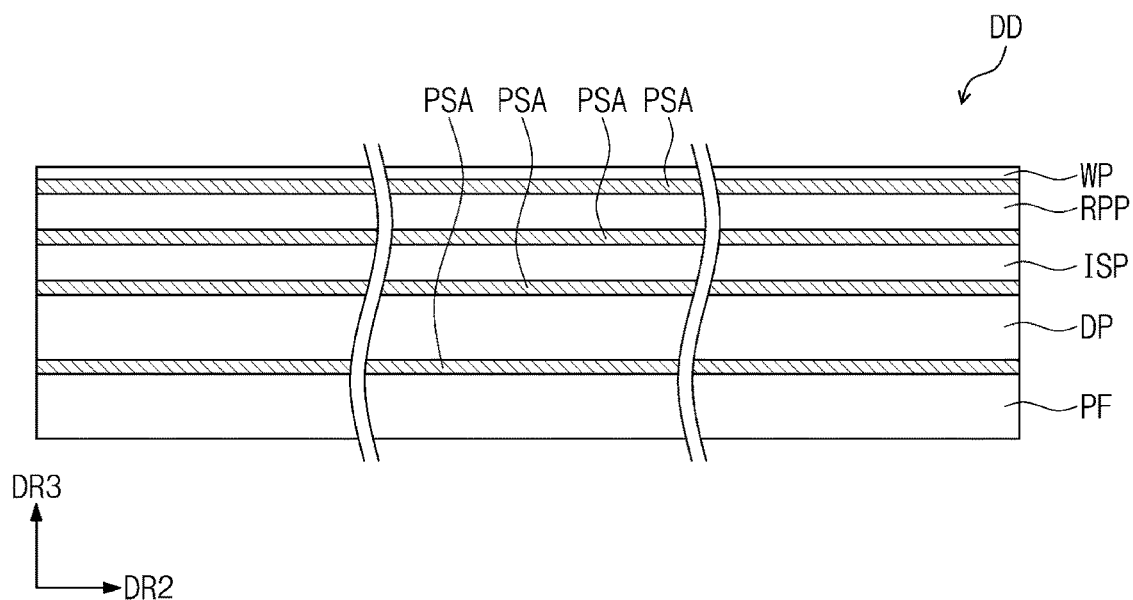
Figure 2D:
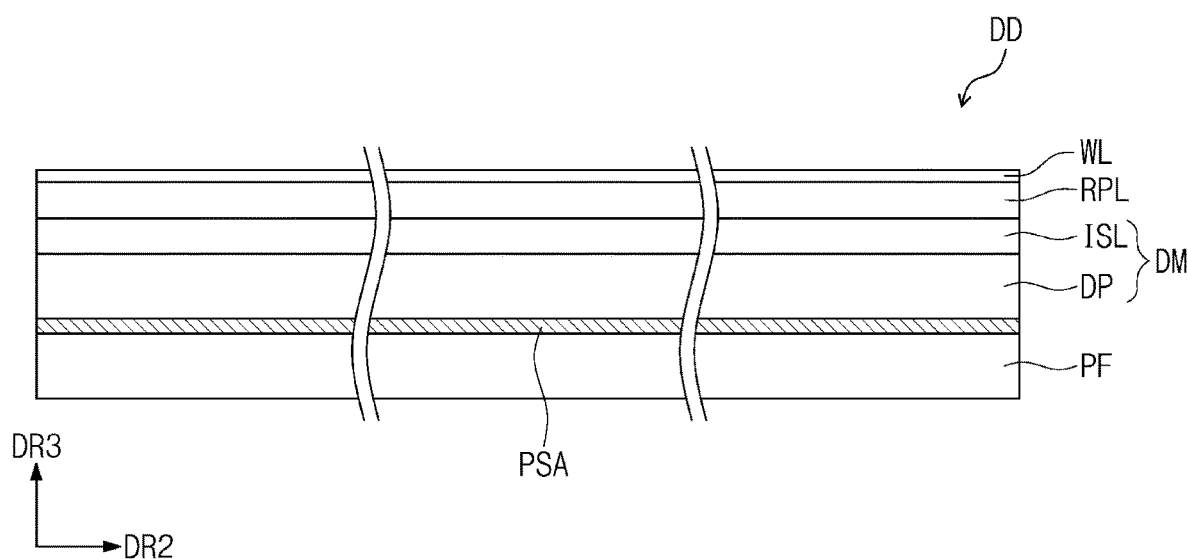

In FIGS. 2B to 2D, the window panel WP and the window layer WL are briefly illustrated without distinction between the base layer WP-BS and the light blocking pattern WP-BZ.

As illustrated in FIGS. 2B and 2C, the display device DD may include the protective panel PF, the display panel DP, the anti-reflection panel RPP, the input sensor ISP, and the window panel WP. The stacking sequence of the input sensor ISP and the anti-reflection panel RPP may be changed.

As illustrated in FIG. 2D, the display device DD may include the protective panel PF, the display panel DP, the input sensing layer ISL, the anti-reflection layer RPL, and the window layer WL. Adhesive members may be omitted from the display device DD, and the input sensing layer ISL, the anti-reflection layer RPL, and the window layer WL may be formed through a continuous process on a base surface provided by the display panel DP. The stacking sequence of the input sensing layer ISL and the anti-reflection layer RPL may be changed.

The anti-reflection layer RPL may include a liquid-crystal coating type phase retarder and a liquid-crystal coating type polarizer. The phase retarder and the polarizer may include a discotic liquid-crystal layer having a tilt angle in one direction.

Figure 3:
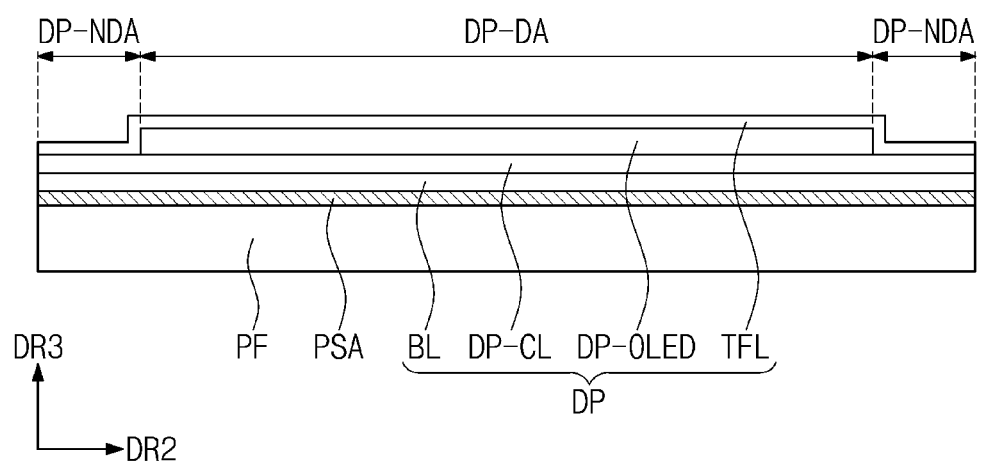
FIG. 3 is a sectional view of a display panel according to an embodiment of the present disclosure.
Figure 4:
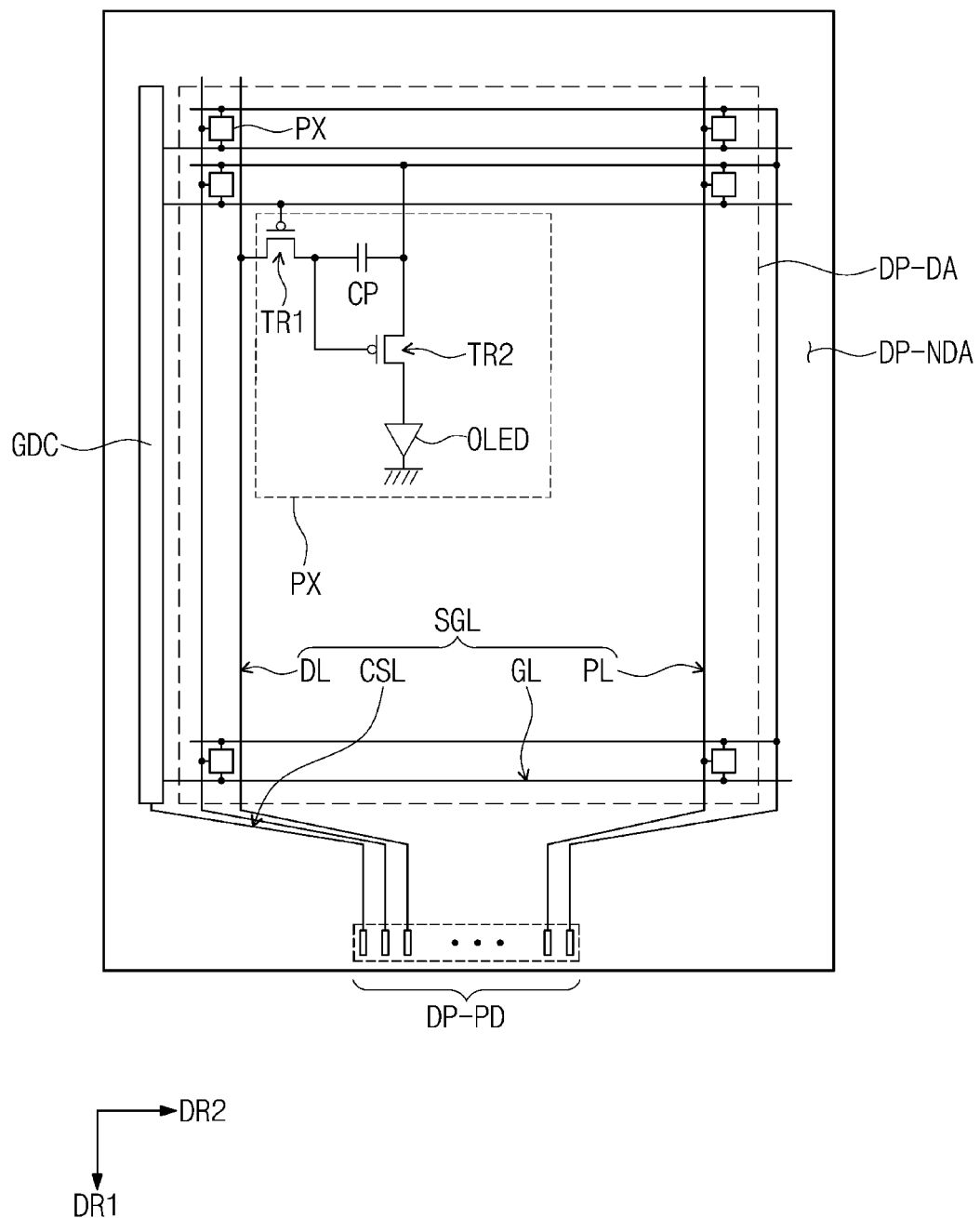
FIG. 4 is a plan view of the display panel according to an embodiment of the present disclosure.
Figure 5:
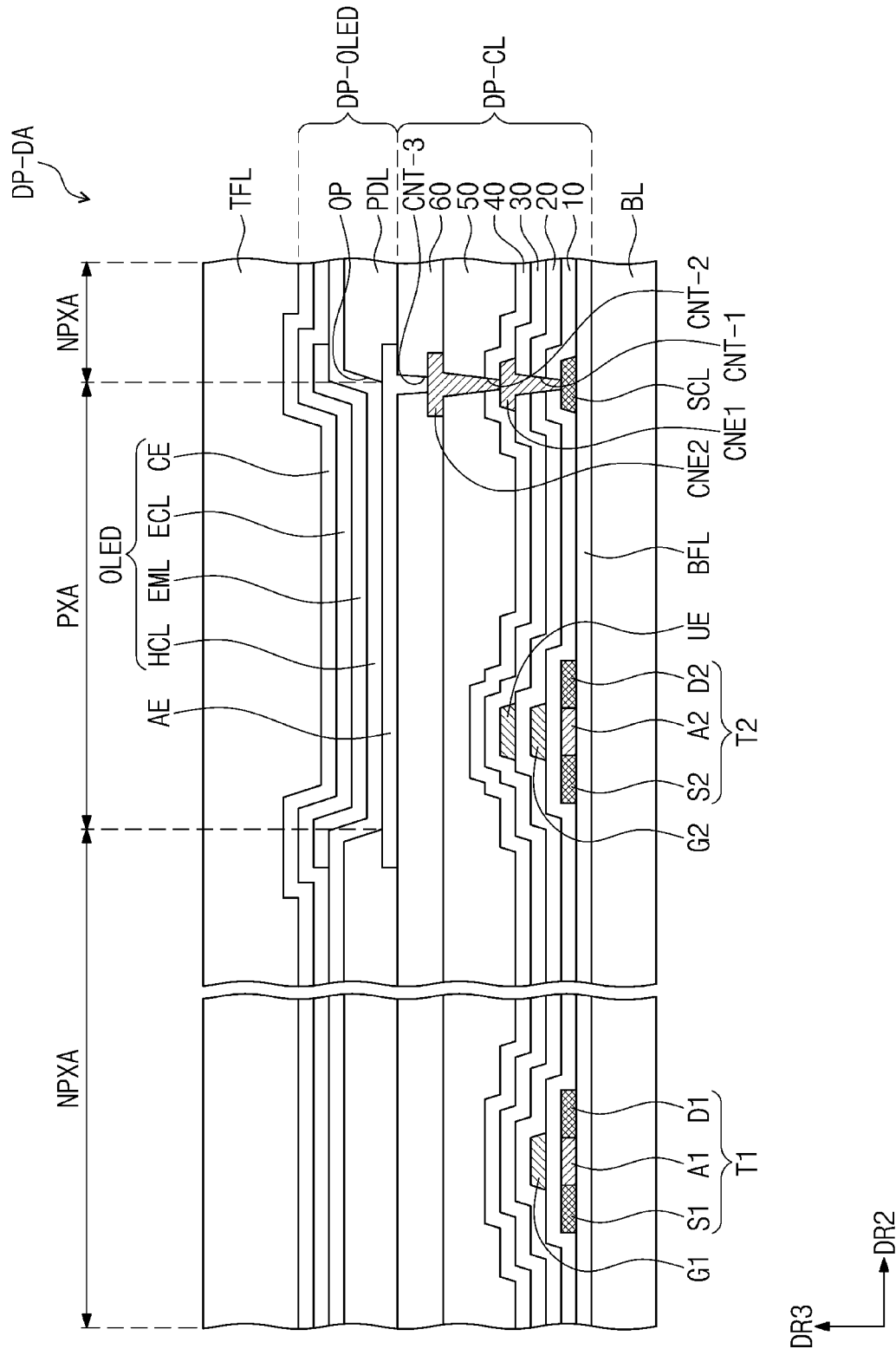
FIG. 5 illustrates a partial section of the display panel corresponding to a pixel illustrated in FIG. 4.

FIG. 3 is a sectional view of the display panel DP according to an embodiment of the present disclosure. FIG. 4 is a plan view of the display panel DP according to an embodiment of the present disclosure. FIG. 5 illustrates a partial section of the display panel DP corresponding to a pixel PX illustrated in FIG. 4. The display panel DP to be described below may be applied to all of the display devices DD described above with reference to FIGS. 2A to 2D. The protective panel PF disposed on the rear surface of the display panel DP is illustrated together in FIG. 4.

As illustrated in FIG. 3, the display panel DP includes a base layer BL, and a circuit element layer DP-CL, a display element layer DP-OLED, and an upper insulating layer TFL that are disposed on the base layer BL.

The base layer BL may include a synthetic resin film. A synthetic resin layer is formed on a working substrate used in manufacture of the display panel DP. Thereafter, a conductive layer and an insulating layer are formed on the synthetic resin layer. The synthetic resin layer corresponds to the base layer BL. The synthetic resin layer may contain a thermosetting resin. In particular, the synthetic resin layer may be a polyimide-based resin layer, and the material thereof is not particularly limited. In addition, the base layer BL may include a glass substrate, a metal substrate, or an organic/inorganic composite substrate.

The circuit element layer DP-CL includes at least one insulating layer and a circuit element. Hereinafter, the insulating layer included in the circuit element layer DP-CL is referred to as the intermediate insulating layer. The intermediate insulating layer may include at least one intermediate inorganic film and/or at least one intermediate organic film. The circuit element includes a signal line and a pixel drive circuit. The circuit element layer DP-CL may be formed by forming an insulating layer, a semiconductor layer, and a conductive layer by coating, deposition, or the like and patterning the insulating layer, the semiconductor layer, and the conductive layer by a photolithography process.

The display element layer DP-OLED includes light emitting elements. The display element layer DP-OLED may include organic light emitting diodes. The display element layer DP-OLED may include an organic film such as a pixel defining film.

The upper insulating layer TFL seals at least the display element layer DP-OLED. The upper insulating layer TFL may include a thin-film encapsulation layer TFL. The upper insulating layer TFL may further include another functional thin film. The thin-film encapsulation layer may include at least one inorganic film (hereinafter, referred to as the inorganic encapsulation film). The thin-film encapsulation layer according to an embodiment of the present disclosure may include at least one organic film (hereinafter, referred to as the organic encapsulation film) and at least one inorganic encapsulation film.

The inorganic encapsulation film protects the display element layer DP-OLED from moisture/oxygen, and the organic encapsulation film protects the display element layer DP-OLED from foreign matter such as dust particles. The inorganic encapsulation film may include, but is not particularly limited to, a silicon nitride layer, a silicon oxy nitride layer, a silicon oxide layer, a titanium oxide layer, or an aluminum oxide layer. The organic encapsulation film may include, but is not particularly limited to, an acrylate-based organic film.

In an embodiment of the present disclosure, the upper insulating layer TFL may be omitted. The upper insulating layer TFL may be replaced with an encapsulation substrate such as a glass substrate. The encapsulation substrate may be coupled to the display panel DP by a sealant. The sealant disposed on the non-display area DP-NDA (refer to FIG. 4) may directly combine the encapsulation substrate and the circuit element layer DP-CL.

As illustrated in FIG. 4, the display panel DP may include a drive circuit GDC, a plurality of signal lines SGL (hereinafter, referred to as the signal lines), a plurality of signal pads DP-PD (hereinafter, referred to as the signal pads), and a plurality of pixels PX (hereinafter, referred to as the pixels).

The drive circuit GDC may include a scan drive circuit. The scan drive circuit generates a plurality of scan signals (hereinafter, referred to as the scan signals) and sequentially outputs the scan signals to a plurality of scan lines GL (hereinafter, referred to as the scan lines) to be described below. The scan drive circuit may additionally output another control signal to a drive circuit of the pixels PX.

The scan drive circuit may include a plurality of transistors formed through the same process as the drive circuit of the pixels PX, for example, a low-temperature polycrystalline silicon (LTPS) process or a low-temperature polycrystalline oxide (LTPO) process.

The signal lines SGL include the scan lines GL, data lines DL, a power line PL, and a control signal line CSL. Each of the scan lines GL is connected to a corresponding one of the pixels PX, and each of the data lines DL is connected to a corresponding one of the pixels PX. The power line PL is connected to the pixels PX. The control signal line CSL may provide control signals to the scan drive circuit.

A display area DP-DA may be defined as an area where the pixels PX are disposed. A plurality of electronic elements are disposed in the display area DP-PA. The electronic elements include an organic light emitting diode provided for each of the pixels PX and a pixel drive circuit connected to the organic light emitting diode. The drive circuit GDC, the signal lines SGL, the signal pads DP-PD, and the pixel drive circuit may be included in the circuit element layer DP-CL illustrated in FIG. 3.

The pixel PX may include, for example, a first transistor T1, a second transistor T2, a capacitor CP, and an organic light emitting diode OLED. The pixel drive circuit includes a switching transistor and a drive transistor, but is not limited to the embodiment illustrated in FIG. 4. The first transistor T1 is connected to a scan line GL and a data line DL. The organic light emitting diode OLED receives a power voltage provided by the power line PL.

Referring to FIG. 5, the display panel DP may include a plurality of insulating layers, a semiconductor pattern, a conductive pattern, a signal line, and the like. An insulating layer, a semiconductor layer, and a conductive layer are formed by coating, deposition, or the like. Thereafter, the insulating layer, the semiconductor layer, and the conductive layer may be selectively subjected to patterning by photolithography. The semiconductor pattern, the conductive pattern, and the signal line included in the circuit element layer DP-CL and the display element layer DP-OLED are formed by the above-described method.

At least one inorganic layer is formed on the upper surface of the base layer BL. The inorganic layer may contain at least one of aluminum oxide, titanium oxide, silicon oxide, silicon oxy nitride, zirconium oxide, and hafnium oxide. The inorganic layer may include multiple layers. The multiple inorganic layers may constitute a barrier layer and/or a buffer layer. In this embodiment, the display panel DP is illustrated as including a buffer layer BFL.

The buffer layer BFL may improve a bonding force with the semiconductor pattern. The buffer layer BFL may include silicon oxide layers and silicon nitride layers. The silicon oxide layers and the silicon nitride layers may be alternately stacked one above another.

The semiconductor pattern is disposed on the buffer layer BFL. The semiconductor pattern may contain poly-silicon. However, without being limited thereto, the semiconductor pattern may contain amorphous silicon or metal oxide.

FIG. 5 illustrates only part of the semiconductor pattern and the semiconductor pattern may be additionally disposed in another area of the pixel PX in a plan view. The semiconductor pattern may be arranged across the pixels PX according to a specific rule. The semiconductor pattern has different electrical properties depending on whether the semiconductor pattern is doped or not. The semiconductor pattern may include a doped area and an undoped area. The doped area may be doped with an N-type dopant or a P-type dopant. A P-type transistor includes a doped area doped with a P-type dopant.

The doped area has a higher conductivity than the undoped area and substantially serves as an electrode or a signal line. The undoped area substantially corresponds to an active area (or, a channel) of a transistor. In other words, a portion of the semiconductor pattern may be an active area of a transistor, another portion may be a source or drain of the transistor, and another portion may be a connecting electrode or a connecting signal line.

As illustrated in FIG. 5, a source S1, an active area A1, and a drain D1 of the first transistor T1 are formed from the semiconductor pattern, and a source S2, an active area A2, and a drain D2 of the second transistor T2 are formed from the semiconductor pattern. The sources S1 and S2 and the drains D1 and D2 are disposed on opposite side of the active areas A1 and A2, respectively. FIG. 5 illustrates a portion of a connecting signal line SCL formed from the semiconductor pattern. Although not separately illustrated, the connecting signal line SCL may be connected to the drain D2 of the second transistor T2 in a plan view.

A first insulating layer 10 is disposed on the buffer layer BFL on the semiconductor pattern. The first insulating layer 10 commonly overlaps the plurality of pixels PX (refer to FIG. 4) and covers the semiconductor pattern. The first insulating layer 10 may be an inorganic layer and/or an organic layer and may have a single layer structure or a multi-layer structure. The first insulating layer 10 may contain at least one of aluminum oxide, titanium oxide, silicon oxide, silicon oxy nitride, zirconium oxide, and hafnium oxide. In this embodiment, the first insulating layer 10 may be a single layer of silicon oxide. Not only the first insulating layer 10 but also insulating layers of the circuit element layer DP-CL, which will be described below, may be inorganic layers and/or organic layers and may have a single layer structure or a multi-layer structure. The inorganic layers may contain at least one of the aforementioned materials.

Gates G1 and G2 are disposed on the first insulating layer 10. The gate G1 may be part of a metal pattern. The gates G1 and G2 overlap the active areas A1 and A2, respectively. The gates G1 and G2 serve as self-aligned masks in a process of doping the semiconductor pattern.

A second insulating layer 20 covering the gates G1 and G2 is disposed on the first insulating layer 10. The second insulating layer 20 commonly overlaps the pixels PX (refer to FIG. 4). The second insulating layer 20 may be an inorganic layer and/or an organic layer and may have a single layer structure or a multi-layer structure. In this embodiment, the second insulating layer 20 may be a single layer of silicon oxide.

An upper electrode UE may be disposed on the second insulating layer 20. The upper electrode UE may overlap the gate G2 of the second transistor T2. The upper electrode UE may be a portion of the metal pattern. A portion of the gate G2 and the upper electrode UE overlapping the gate G2 may constitute the capacitor CP (refer to FIG. 4). In an embodiment of the present disclosure, the upper electrode UE may be omitted.

A third insulating layer 30 covering the upper electrode UE is disposed on the second insulating layer 20. In this embodiment, the third insulating layer 30 may be a single layer of silicon oxide. A first connecting electrode CNE1 may be disposed on the third insulating layer 30. The first connecting electrode CNE1 may be connected to the connecting signal line SCL through a contact hole CNT-1 formed through the first, second, and third insulating layers 10, 20, and 30.

A fourth insulating layer 40 is disposed on the third insulating layer 30. The fourth insulating layer 40 may be a signal layer of silicon oxide. A fifth insulating layer 50 is disposed on the fourth insulating layer 40. The fifth insulating layer 50 may be an organic layer. A second connecting electrode CNE2 may be disposed on the fifth insulating layer 50. The second connecting electrode CNE2 may be connected to the first connecting electrode CNE1 through a contact hole CNT-2 formed through the fourth insulating layer 40 and the fifth insulating layer 50.

A sixth insulating layer 60 covering the second connecting electrode CNE2 is disposed on the fifth insulating layer 50. The sixth insulating layer 60 may be an organic layer. A first electrode AE (or, an anode) is disposed on the sixth insulating layer 60. The first electrode AE is connected to the second connecting electrode CNE2 through a contact hole CNT-3 formed through the sixth insulating layer 60. A pixel defining film PDL covering edges of the first electrode AE is disposed on the first electrode AE. An opening OP is defined in a pixel defining film PDL. The opening OP of the pixel defining film PDL exposes at least a portion of the first electrode AE.

As illustrated in FIG. 5, the display area DP-DA may include an emissive area PXA and a non-emissive area NPXA disposed adjacent to the emissive area PXA. The non-emissive area NPXA may surround the emissive area PXA in a plan view. In this embodiment, the emissive area PXA is defined to correspond to a partial area of the first electrode AE exposed through the opening OP.

A hole control layer HCL may be commonly disposed in the emissive area PXA and the non-emissive area NPXA. The hole control layer HCL may include a hole transporting layer and may further include a hole injection layer. An emissive layer EML is disposed on the hole control layer HCL. The emissive layer EML may be disposed in an area corresponding to the opening OP. That is, the emissive layer EML may be separately formed for each of the pixels.

An electron control layer ECL is disposed on the emissive layer EML. The electron control layer ECL may include an electron transporting layer and may further include an electron injection layer. The hole control layer HCL and the electron control layer ECL may be formed to cover the plurality of pixels by using an open mask. A second electrode CE (or, a cathode) is disposed on the electron control layer ECL. The second electrode CE has an integrated shape and is commonly disposed for the plurality of pixels PX (refer to FIG. 4). As illustrated in FIG. 5, the upper insulating layer TFL is disposed on the second electrode CE. The hole control layer HCL, the electron control layer ECL, and the emissive layer EML may define the organic light emitting diode OLED.

Figure 6:
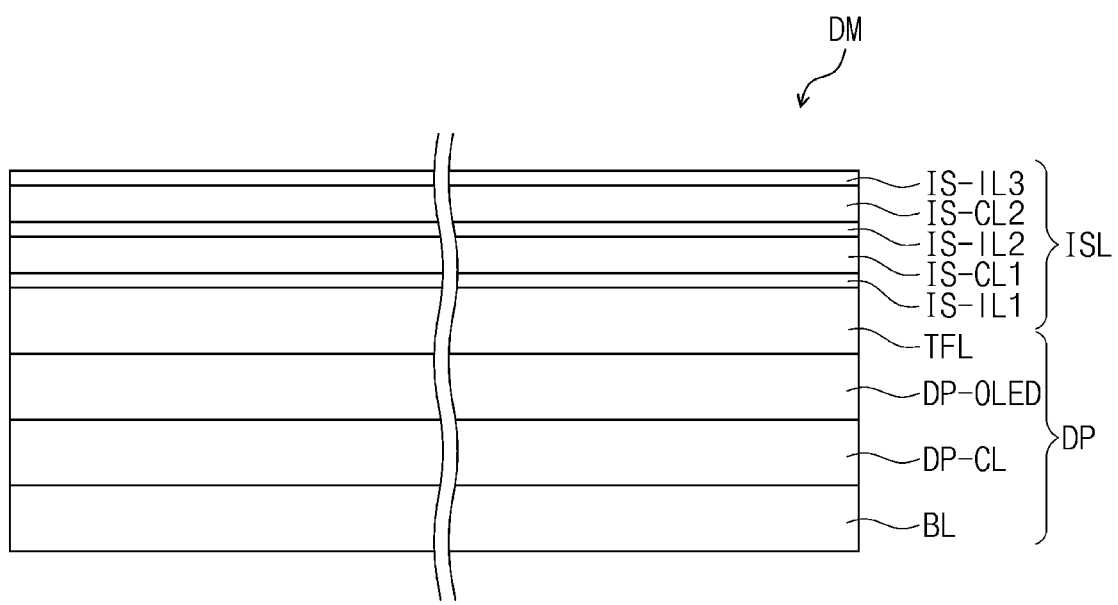
FIG. 6 is a sectional view of a display module according to an embodiment of the present disclosure.
Figure 6:

FIG. 6 is a sectional view of the display module DM according to an embodiment of the present disclosure.

FIG. 6 illustrates an input sensor directly disposed on the upper insulating layer TFL. However, the input sensor may be formed on a substrate and the substrate may be attached to the upper insulating layer TFL using an adhesive. The input sensor may have a multi-layer structure. The input sensor may include a sensing electrode, a signal line connected to the sensing electrode, and at least one insulating layer. The input sensor may sense an external input by, for example, a capacitive method.

As illustrated in FIG. 6, the input sensing layer ISL may include a first insulating layer IS-IL1 (or, a first sensor insulating layer), a first conductive layer IS-CL1, a second insulating layer IS-IL2 (or, a second sensor insulating layer), a second conductive layer IS-CL2, and a third insulating layer IS-IL3 (or, a third sensor insulating layer). The first insulating layer IS-IL1 may be directly disposed on the upper insulating layer TFL. In an embodiment of the present disclosure, the first insulating layer IS-IL1 and/or the third insulating layer IS-IL3 may be omitted.

The first conductive layer IS-CL1 and the second conductive layer IS-CL2 may have a single layer structure, or may have a multi-layer structure stacked along the third directional axis DR3. A conductive layer having a multi-layer structure may include at least two of transparent conductive layers and metal layers. The multi-layered conductive layer may include metal layers containing different metals. The transparent conductive layers may contain indium tin oxide (ITO), indium zinc oxide (IZO), zinc oxide (ZnO), indium tin zinc oxide (ITZO), PEDOT, metal nanowire, and graphene. The metal layers may contain molybdenum, silver, titanium, copper, or aluminum, and an alloy thereof. For example, each of the first conductive layer IS-CL1 and the second conductive layer IS-CL2 may have a three-layer structure of metals, for example, a three-layer structure of titanium/aluminum/titanium. Metal having a relatively high durability and a low reflectivity may be applied to an outer layer and metal having a high electrical conductivity may be applied to an inner layer.

Each of the first conductive layer IS-CL1 and the second conductive layer IS-CL2 includes a plurality of conductive patterns. Hereinafter, it will be illustrated that the first conductive layer IS-CL1 includes first conductive patterns and the second conductive layer IS-CL2 includes second conductive patterns. The first conductive patterns and the second conductive patterns may each include sensing electrodes and signal lines connected thereto.

Each of the first insulating layer IS-ILL the second insulating layer IS-IL2, and the third insulating layer IS-IL3 may include an inorganic film or an organic film. In this embodiment, the first insulating layer IS-IL1 and the second insulating layer IS-IL2 may be inorganic films. The inorganic films may contain at least one of aluminum oxide, titanium oxide, silicon oxide, silicon oxy nitride, zirconium oxide, and hafnium oxide. The third insulating layer IS-IL3 may include an organic film. The organic film may contain at least one of an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

In this embodiment, the second insulating layer IS-IL2 may cover a sensing area IS-DA to be described below. That is, the second insulating layer IS-IL2 may entirely overlap the sensing area IS-DA. Although not separately illustrated, the second insulating layer IS-IL2 may include a plurality of insulating patterns in an embodiment of the present disclosure.

Figure 7:
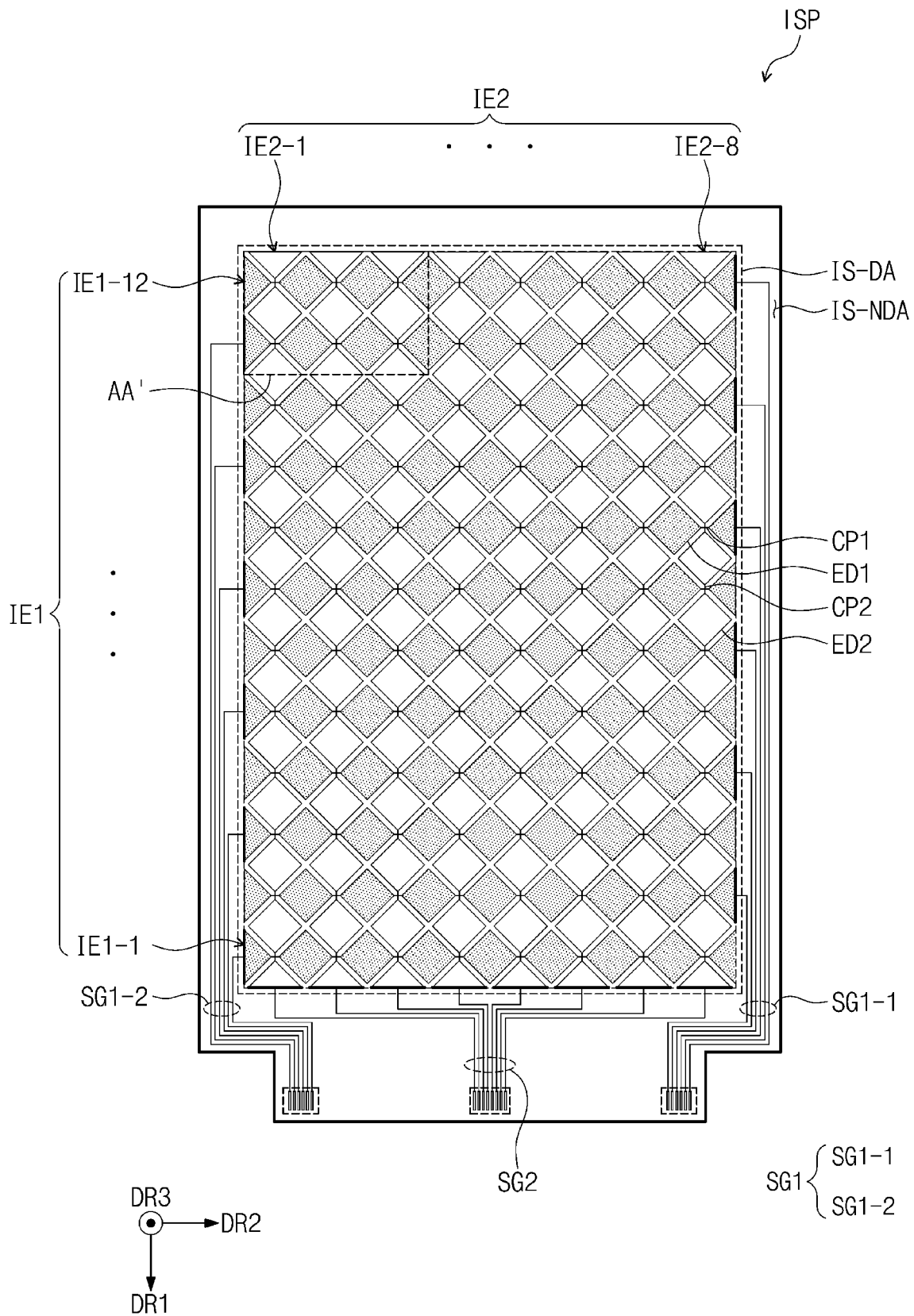
FIG. 7 is a plan view of an input sensor according to an embodiment of the present disclosure.

FIG. 7 is a plan view of an input sensor according to an embodiment. The shapes of sensor electrodes IE1 and IE2 included in the input sensor ISP may be diversely designed, and FIG. 7 illustrates the shapes of the sensor electrodes IE1 and IE2. The sensor electrodes IE1 and IE2 may include the first sensing electrode IE1 and the second sensing electrode IE2.

Referring to FIG. 7, the input sensor ISP may include the first sensing electrode IE1, the second sensing electrode IE2, and signal line groups connected to the first and second sensing electrodes IE1 and IE2. In this embodiment, the input sensor ISP including two signal line groups SG1 and SG2 is illustrated.

The input sensor ISP may include a sensing area IS-DA and a non-sensing area IS-NDA that correspond to the display area DP-DA and the non-display area DP-NDA of the display panel DP, respectively. The first sensing electrode IE1 and the second sensing electrode IE2 may be disposed in the sensing area IS-DA and the first signal line group SG1 and the second signal line group SG2 may be disposed in the non-sensing area IS-NDA.

In this embodiment, the input sensor ISP may be a capacitive touch sensor. The input sensor ISP may obtain information about an external input through a change in mutual capacitance between the first sensing electrode IE1 and the second sensing electrode IE2.

One of the first sensing electrode IE1 and the second sensing electrode IE2 may receive a driving signal, and the other may output a change in mutual capacitance between the first sensing electrode IE1 and the second sensing electrode IE2 as a sensing signal. The input sensor ISP may divide an operating section into a first operating section and a second operating section. The input sensor ISP may operate as described above in the first operating period and may operate in contrast to the above description in the second operating period.

The first sensing electrode IE1 may include a plurality of first sensing electrodes IE1-1 to IE1-12 (hereinafter, referred to as the first sensing electrodes IE1-1 to IE1-12). FIG. 7 illustrates the twelve first sensing electrodes IE1-1 to IE1-12. Each of the first sensing electrodes IE1-1 to IE1-12 may have a shape extending in the second direction DR2. The first sensing electrodes IE1-1 to IE1-12 may be arranged in the first direction DR1.

The second sensing electrode IE2 may include a plurality of second sensing electrodes IE2-1 to IE2-8 (hereinafter, referred to as the second sensing electrodes IE2-1 to IE2-8). FIG. 7 illustrates the eight second sensing electrodes IE2-1 to IE2-8. The second sensing electrodes IE2-1 to IE2-8 may have a shape extending in the first direction DR1. The second sensing electrodes IE2-1 to IE2-8 may be arranged in the second direction DR2.

The lengths or areas of the first sensing electrodes IE1-1 to IE1-12 and the second sensing electrodes IE2-1 to IE2-8 may vary depending on the arrangement of the sensing electrodes and the area of the sensing area IS-DA.

The first signal line group SG1 may include the same number of first signal lines as the first sensing electrodes IE1-1 to IE1-12. Each of the first signal lines may be connected to one of opposite distal ends of a corresponding one of the first sensing electrodes IE1-1 to IE1-12. Without being limited thereto, the opposite distal ends of the first sensing electrodes IE1-1 to IE1-12 may be connected to the first signal lines.

The second signal line group SG2 may include the same number of second signal lines as the second sensing electrodes IE2-1 to IE2-8. Each of the second signal lines may be connected to one of opposite distal ends of a corresponding one of the second sensing electrodes IE2-1 to IE2-8. FIG. 7 illustrates the signal lines of the second signal line group SG2 that are connected to lower ends of the second sensing electrodes IE2-1 to IE2-8.

The first signal line group SG1 may include two groups. One group may be a first signal line group SG1-1 disposed on one side of the sensing area IS-DA and the other group may include be a first signal line group SG1-2 disposed on the other side of the sensing area IS-DA.

Each of the first signal lines in the first signal line group SG1-1 may be connected to one side of a corresponding one of the first sensing electrodes IE1-1 to IE1-12, and each of the first signal lines in the first signal line group SG1-2 may be connected to an opposite side of a corresponding one of the first sensing electrodes IE1-1 to IE1-12. The first signal line group SG1-1 and the first signal line group SG1-2 may be spaced apart from each other in the second direction DR2 with the sensing area IS-DA disposed therebetween. As the first signal lines are separately disposed on the opposite sides, the width of the non-sensing area IS-NDA on each side of the sensing area IS-DA may be decreased.

The first signal line group SG1-1 may be electrically connected to the odd-numbered sensing electrodes or the even-numbered sensing electrodes among the first sensing electrodes IE1-1 to IE1-12. The first signal line group SG1-2 may be connected to the sensing electrodes to which the first signal line group SG1-1 is not connected. In FIG. 7, the first signal line group SG1-1 is illustrated as being connected to right ends of the even-numbered first sensing electrodes.

Each of the first sensing electrodes IE1-1 to IE1-12 may include a plurality of first electrodes ED1 and a plurality of first connecting parts CP1. The first electrodes ED1 may extend along a second direction and be arranged in the first direction DR1. Each of the first connecting parts CP1 may connect two first electrodes ED1 adjacent to each other among the first electrodes ED1.

Each of the second sensing electrodes IE2-1 to IE2-8 may include a plurality of second electrodes ED2 and a plurality of second connecting parts CP2. The second electrodes ED2 may extend along a first direction and be arranged in the second direction DR2. Each of the second connecting parts CP2 may connect two second electrodes ED2 adjacent to each other among the second electrodes ED2.

The first and second connecting parts CP1 and CP2 may cross each other in a plan view. However, without being limited thereto, the first connecting parts CP1 may have the shape of "Λ" and/or "v" so as not to overlap the second connecting parts CP2. The first connecting parts CP1 having the shape of a bent line may overlap the second electrodes ED2 in a plan view.

Figure 8A:
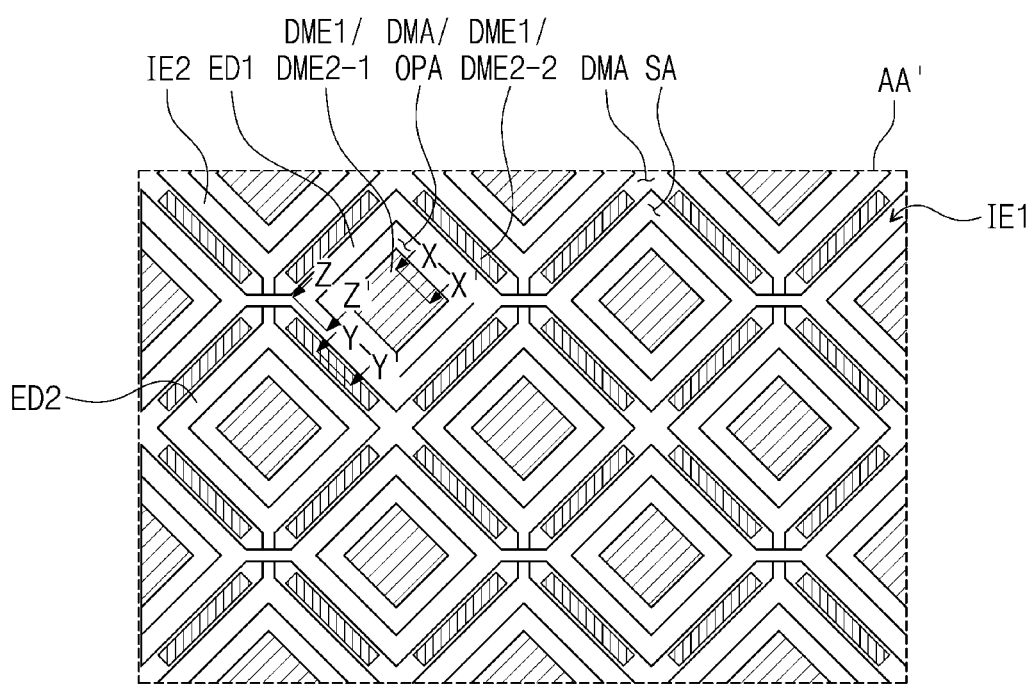
FIG. 8A is an enlarged view illustrating area AA' of FIG. 7.
Figure 8B:
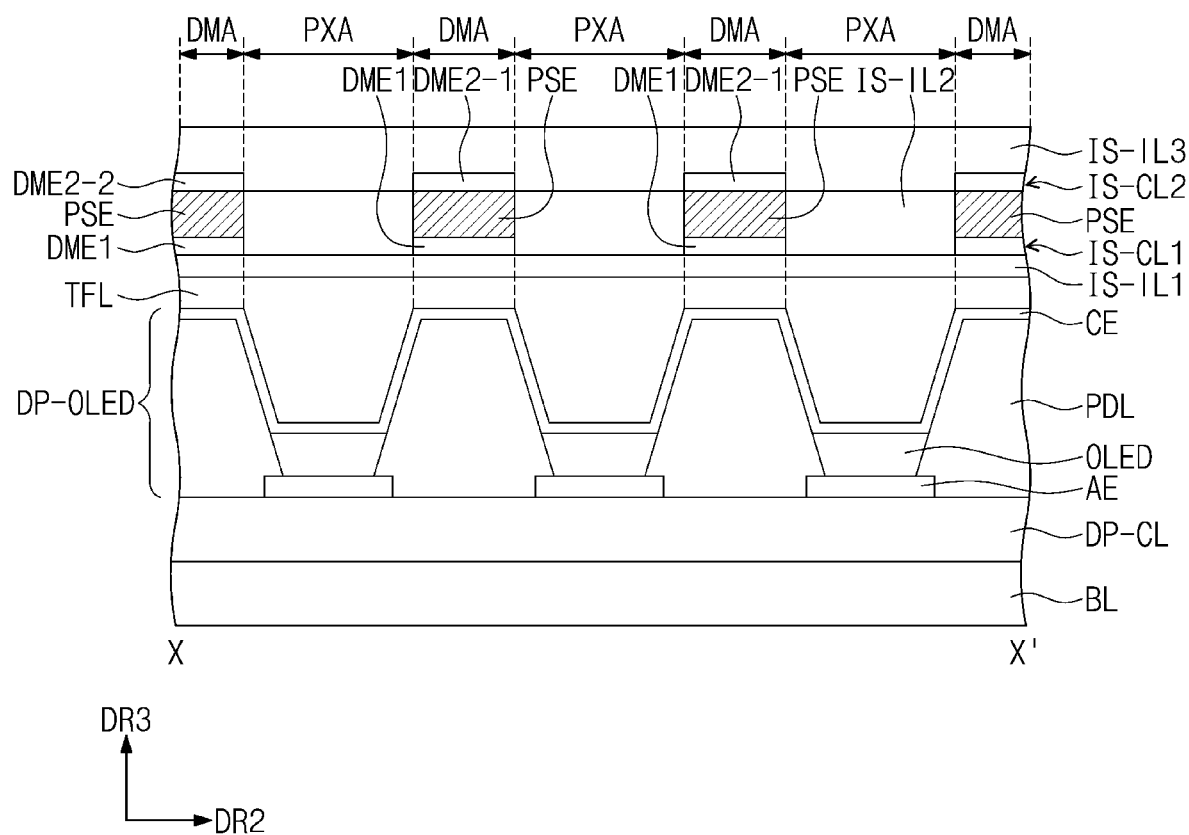
FIG. 8B is a sectional view taken along line X-X' in FIG. 8A.
Figure 8C:
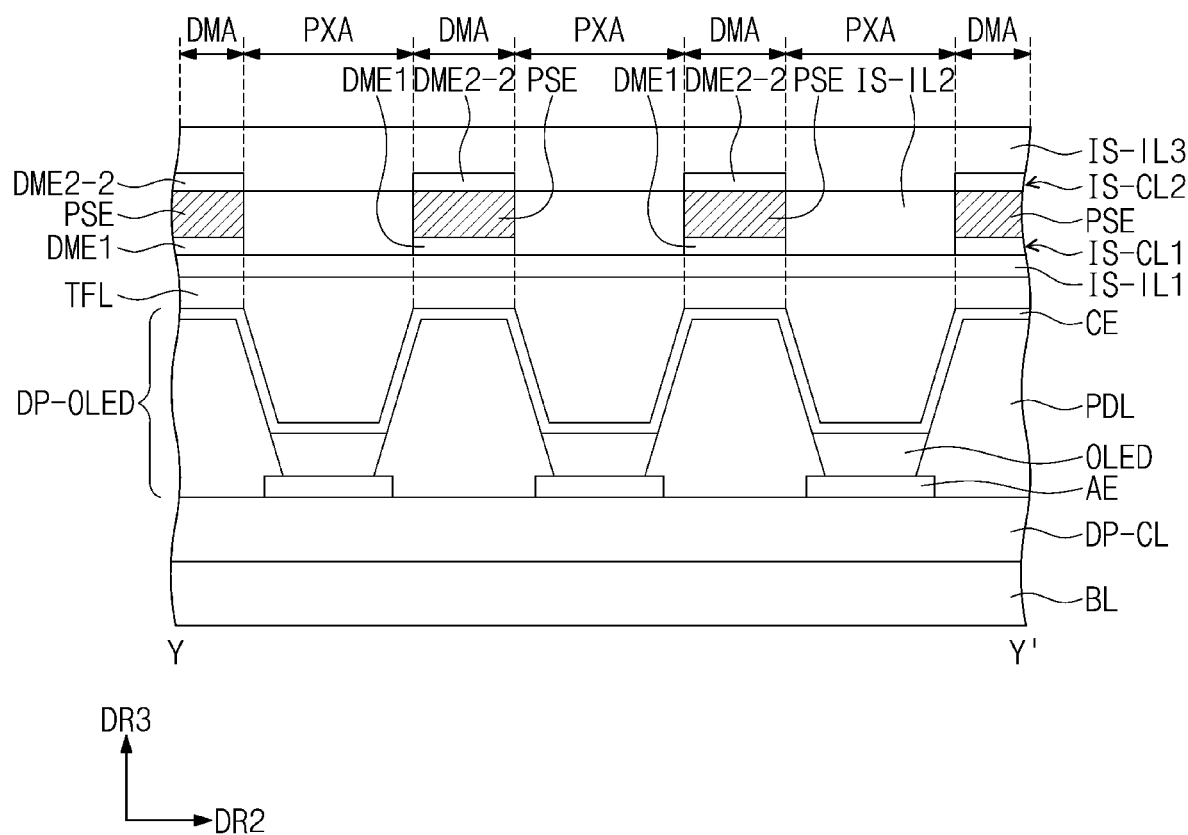
FIG. 8C is a sectional view taken along line Y-Y' in FIG. 8A.
Figure 8D:
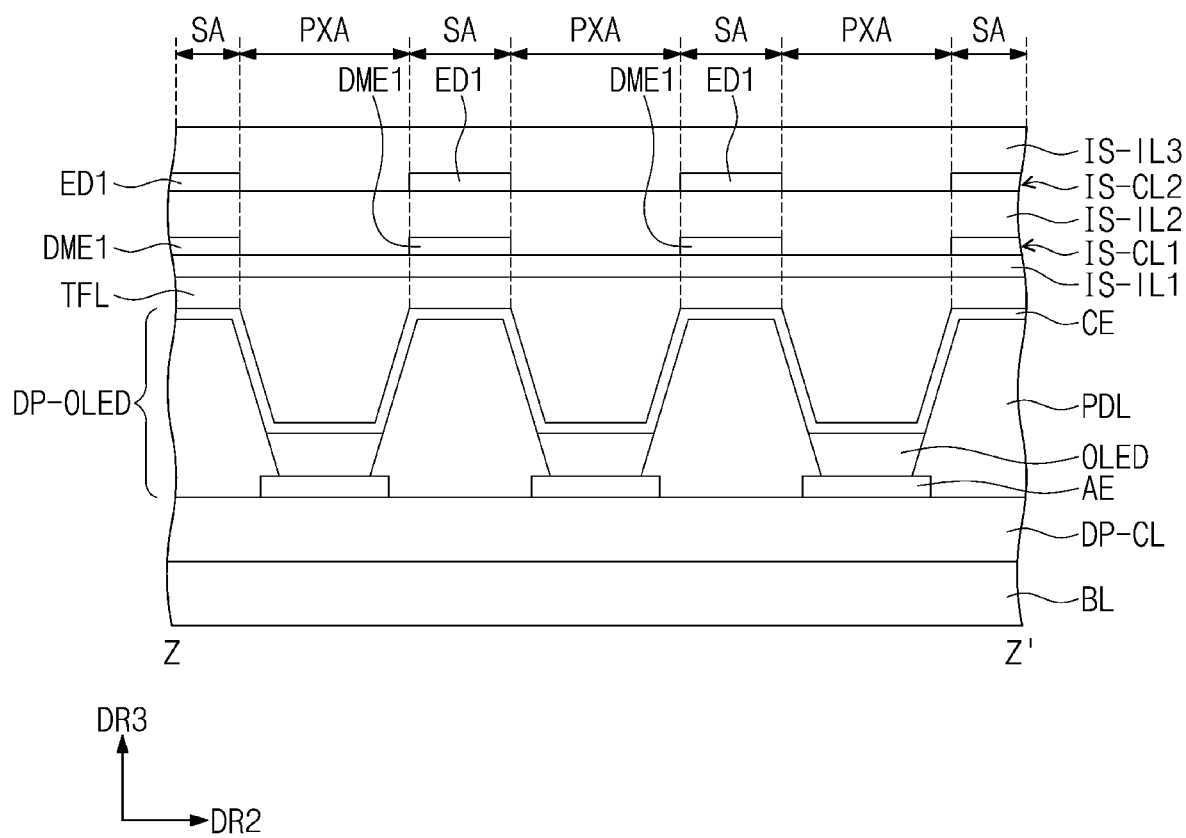
FIG. 8D is a sectional view taken along line Z-Z' in FIG. 8A.
Figure 8E:
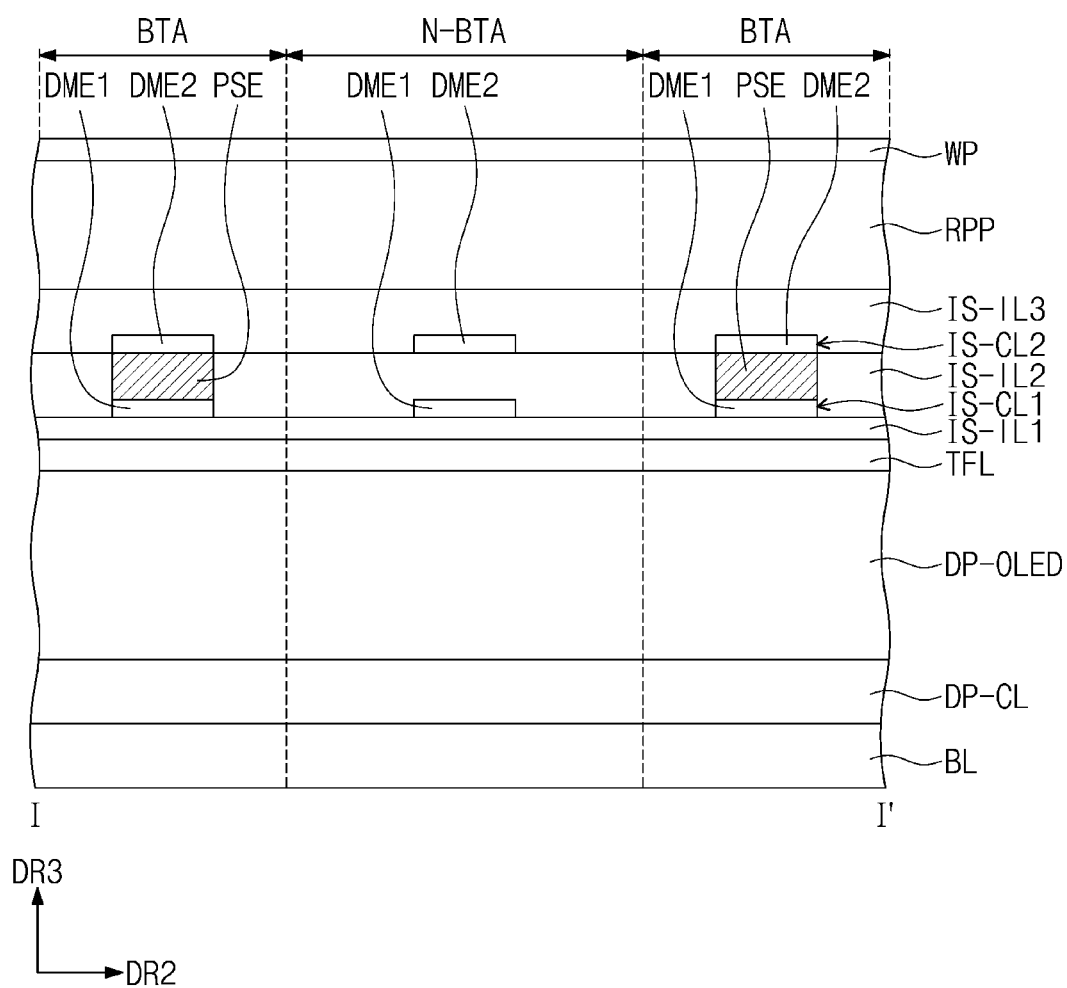
FIG. 8E is a sectional view taken along line I-I' in FIG. 1B.

FIG. 8A is an enlarged view illustrating area AA' of FIG. 7. FIG. 8B is a sectional view taken along line X-X' in FIG. 8A. FIG. 8C is a sectional view taken along line Y-Y' in FIG. 8A. FIG. 8D is a sectional view taken along line Z-Z' in FIG. 8A. FIG. 8E is a sectional view taken along line I-I' in FIG. 1B.

Referring to FIG. 8A, the input sensor ISP (refer to FIG. 7) may include a sensor electrode and a dummy electrode. The sensor electrode and the dummy electrode may be simultaneously patterned. Both the sensor electrode and the dummy electrode may have a mesh structure.

The sensor electrode may include the first sensing electrode IE1 and the second sensing electrode IE2 crossing each other. The sensor electrode may be disposed in a sensor area SA. The sensor area SA corresponds to the area where the first and second sensing electrodes IE1 and IE2 are disposed.

The dummy electrode may include a first dummy electrode DME1 and second dummy electrodes DME2-1 and DME2-2. The first and second dummy electrodes DME1, DME2-1, and DME2-2 may be disposed in a dummy area DMA. The dummy area DMA may correspond to the area where the sensor electrode is not disposed and the dummy electrodes are disposed.

The dummy area DMA may be defined between the first sensing electrode IE1 and the second sensing electrode IE2 in a plan view, and the second dummy electrodes DME2-2 may be disposed in the dummy area DMA.

In an embodiment, an open area OPA may be defined in each of the first electrodes ED1 and each of the second electrodes ED2. The open area OPA may be defined as the area surrounded by the first electrode ED1 or the second electrode ED2. The second dummy electrode DME2-1 rather than a sensor may be disposed in the open area OPA. Accordingly, the open area OPA may correspond to the dummy area DMA.

FIGS. 8B, 8C, and 8D illustrate sectional views of the input sensor. Repetitive descriptions identical to ones given with reference to FIGS. 2A to 2D and 6 will be omitted.

Referring to FIGS. 8B, 8C, and 8D, the input sensor ISP (refer to FIG. 6) may include the first conductive layer IS-CL1 (refer to FIG. 6), the second conductive layer IS-CL2 (refer to FIG. 6), and a pressure sensor electrode PSE.

The first insulating layer IS-IL1 may be disposed on the thin-film encapsulation layer TFL. The first conductive layer IS-CL1 (refer to FIG. 6) may be disposed on the first insulating layer IS-ILE The first insulating layer IS-IL1 may be omitted and the first conductive layer IS-CL1 may be directly disposed on the thin-film encapsulation layer TFL.

The second conductive layer IS-CL2 may be disposed on the second insulating layer IS-IL2. The second conductive layer IS-CL2 may overlap the first conductive layer IS-CL1 in a plan view.

In an embodiment, the first conductive layer IS-CL1 may include the first dummy electrode DME1. The second conductive layer IS-CL2 may include the first and second electrodes ED1 and ED2 and the second dummy electrodes DME2-1 and DME2-2.

In FIG. 8B, the second conductive layer IS-CL2 may include the second dummy electrode DME2-1 overlapping the dummy area DMA defined in the open area OPA. In FIG. 8C, the second conductive layer IS-CL2 may include the second dummy electrode DME2-2 overlapping the dummy area DMA defined between the first sensing electrode IE1 and the second sensing electrode IE2. That is, the second conductive layer IS-CL2 may include the second dummy electrodes DME2-1 and DME2-2 in the dummy area DMA. In FIG. 8D, the second conductive layer IS-CL2 may include the first electrode ED1 overlapping the sensor area SA. In FIG. 8D, which is a sectional view taken along line Z-Z' in FIG. 8A, the first electrode ED1 is illustrated as being disposed in the second conductive layer IS-CL2. However, the first electrode ED1 and the second electrode ED2 may be disposed in the second conductive layer IS-CL2 of the sensor area SA.

The first dummy electrode DME1 may overlap the first and second electrodes ED1 and ED2 or the second dummy electrodes DME2-1 and DME2-2.

The pressure sensor electrode PSE may be disposed between the first conductive layer IS-CL1 and the second conductive layer IS-CL2. The pressure sensor electrode PSE may be disposed between the first dummy electrode DME1 and the second dummy electrodes DME2-1 and DME2-2 to overlap the first dummy electrode DME1 and the second dummy electrodes DME2-1 and DME2-2. Like the first dummy electrode DME1 and the second dummy electrodes DME2-1 and DME2-2, the pressure sensor electrode PSE may have a mesh structure.

Figure 12:
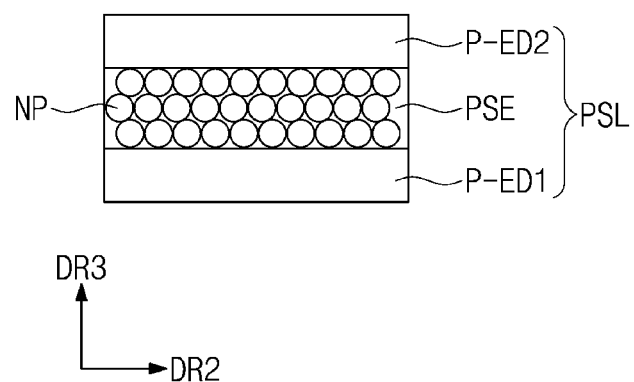
FIG. 12 is a sectional view of a pressure sensor layer according to an embodiment of the present disclosure.

In an embodiment, the pressure sensor electrode PSE may include a quantum tunneling composite (QTC). The pressure sensor electrode PSE may recognize a touch by changing a resistance value depending on pressure applied to the dummy area DMA. The QTC may be formed between the first dummy electrode and the second dummy electrode by an ink-jet method so as to have a fine line-width. The pressure sensor electrode PSE may include a transparent plate (one plate) or nano-particles. The nano-particles may be disposed between two electrodes and may generate an electrical signal in response to applied pressure. FIG. 12 illustrate the nano-particles disposed between pressure sensing patterns.

FIG. 8E is a sectional view illustrating the pressure sensor electrode PSE in a button area BTA where the input section IM-A1 of FIG. 1B is disposed and a peripheral area N-BTA where the non-input section IM-A2 is disposed.

Referring to FIG. 8E, the pressure sensor electrode PSE may be disposed between the first dummy electrode DME1 and second dummy electrodes DME2 in the dummy area DMA overlapping the input section IM-A1. However, the pressure sensor electrode PSE is not disposed between the first dummy electrode DME1 and second dummy electrodes DME2 overlapping the peripheral area N-BTA that does not overlap the input section IM-A1. Accordingly, the display device DD of the present disclosure may provide a sense of touch based on a pressure sensor to a user who enters information through the input section IM-A1 and may provide a more accurate input with a distinction of the input section IM-A1 and the non-input section IM-A2.

A window WP may be disposed on the input sensor ISP including the sensor electrodes IE1 and IE2, the dummy electrodes DME1, DME2-1, and DME2-2, and the pressure sensor electrode PSE. The anti-reflection panel RPP may be disposed between the input sensor ISP and the window WP. The anti-reflection panel RPP may be omitted.

In an embodiment, the window WP may include a thin glass film. The thin glass film may have a thickness of 20 µm to 100 µm. The window WP may contain a flexible material. In the present disclosure, the window WP may include the thin glass film having a small thickness, and thus applied pressure may be easily provided to the pressure sensor electrode PSE of the input sensor ISP through the window WP. Table 1 below shows evaluation results of touch sensitivity depending on thicknesses of the window WP.

TABLE 1

|  | Comparative Example 1 | Embodiment 1 | Embodiment 2 |
| --- | --- | --- | --- |
| Thickness | 500 um | 40 um | 100 um |
| Sensitivity | 150~200 gF | 10~15 gF | 10~15 gF |

Figure 9A:
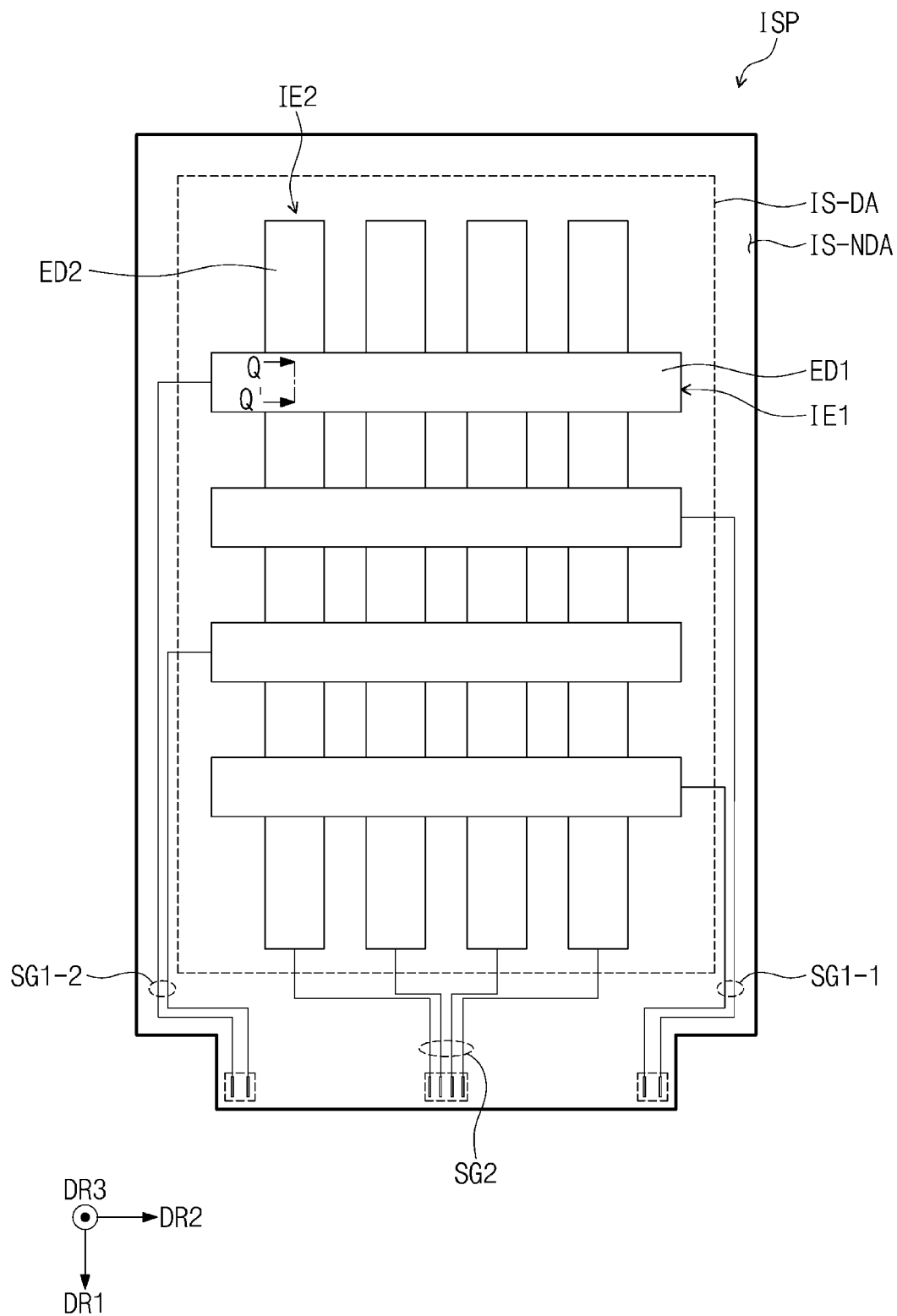
FIG. 9A is a plan view of an input sensor according to an embodiment of the present disclosure.
Figure 9B:
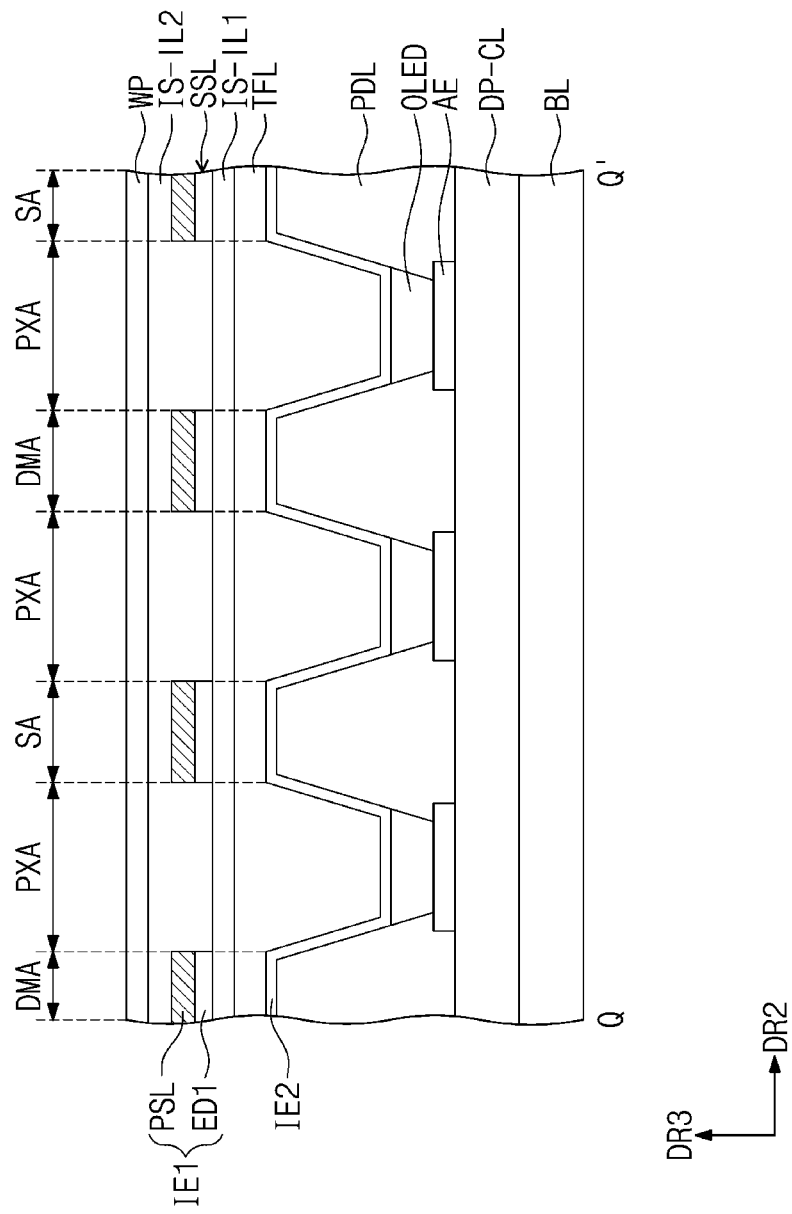
FIG. 9B is a sectional view taken along line Q-Q' in FIG. 9A.
Figure 9C:
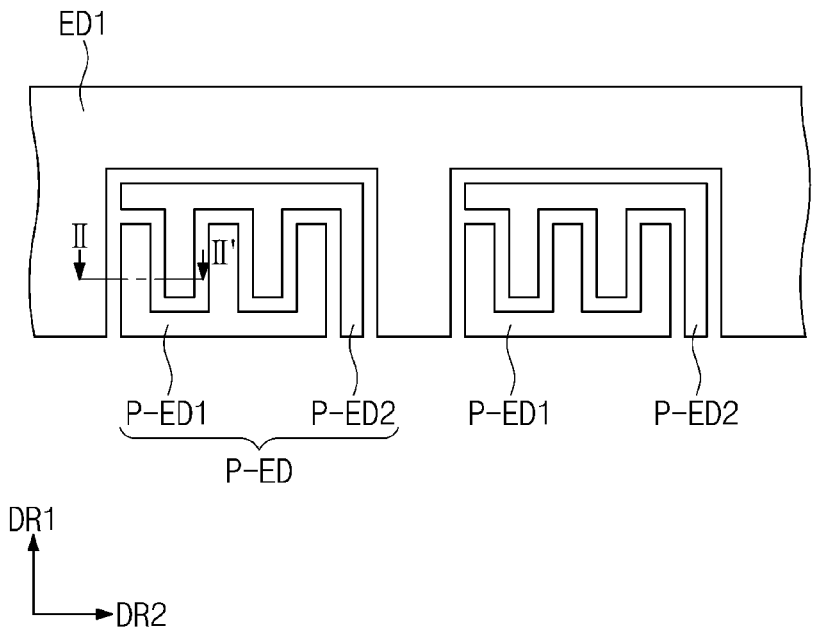
FIG. 9C is an enlarged view illustrating a sensing electrode of FIG. 9A.
Figure 9D:
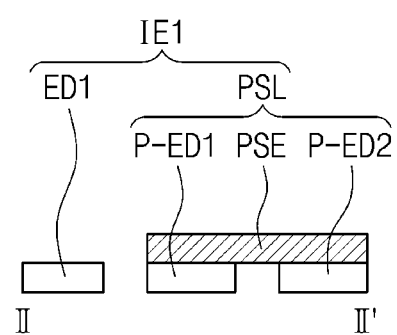
FIG. 9D is a sectional view taken along line II-II' in FIG. 9C.

According to Table 1, in the case of comparative example 1, the window WP has the thickness of a general window. In this case, comparative example 1 may have a sensitivity that is recognized only when the window WP is firmly pressed with a hand. However, embodiment 1 and embodiment 2 have a relatively superior sensitivity to the extent that a brush-touch is possible. FIG. 9A is a plan view of an input sensor according to an embodiment of the present disclosure. FIG. 9B is a sectional view taken along line Q-Q' in FIG. 9A. FIG. 9C is an enlarged view illustrating a sensing electrode of FIG. 9A. FIG. 9D is a sectional view taken along line II-II' in FIG. 9C.

Referring to FIGS. 9A and 9B, the input sensor ISP may include a first sensing electrode IE1 and a second sensing electrode IE2. The first sensing electrode IE1 may be disposed to cross the second sensing electrode IE2. The first sensing electrode IE1 may be disposed on the second sensing electrode IE2. The first sensing electrode IE1 and the second sensing electrode IE2 may have the same pattern width and may be disposed to cross each other.

The first sensing electrode IE1 may include a sensing layer SSL and a pressure sensor layer PSL.

The sensing layer SSL may include a plurality of sensing patterns ED1 that extend in the second direction DR2 and that are arranged in the first direction DR1.

Referring to FIGS. 9C and 9D, the pressure sensor layer PSL may include a first pressure sensing pattern P-ED1, a second pressure sensing pattern P-ED2, and a pressure sensor electrode PSE. The pressure sensor electrode PSE may be disposed on the first pressure sensing pattern P-ED1 and the second pressure sensing pattern P-ED2 to overlap the first pressure sensing pattern P-ED1 and the second pressure sensing pattern P-ED2.

Each of the first pressure sensing pattern P-ED1 and the second pressure sensing pattern P-ED2 may have a comb structure. The first pressure sensing pattern P-ED1 and the second pressure sensing pattern P-ED2 may have an interdigitated configuration. The first pressure sensing pattern P-ED1 and the second pressure sensing pattern P-ED2 may be disposed on the same layer as the sensing pattern ED1. The sensing pattern ED1, the first pressure sensing pattern P-ED1, and the second pressure sensing pattern P-ED2 may be patterned together.

The second sensing electrode IE2 may be disposed on an emissive layer OLED. A thin-film encapsulation layer TFL may be disposed between the first sensing electrode IE1 and the second sensing electrode IE2.

In this embodiment, a display element layer DP-OLED may include a first electrode AE, the emissive layer OLED, and a second electrode IE2. The second electrode IE2 may correspond to the second sensing electrode IE2.

More specifically, the second electrode IE2 may be a component of the input sensor ISP at the same time as being a component of the display element layer OP-OLED (refer to FIG. 5). The second electrode IE2 may constitute the display element layer DP-OLED of the display panel DP and may display an image. The second electrode IE2 may correspond to an electrode of the input sensor ISP and may sense an input of a user. For example, the second electrode IE2 may operate in a time-division manner. The second electrode IE2 may serve as a cathode of the display panel to display an image together with the first electrode AE that is an anode, or may serve as the second sensing electrode IE2 of the input sensor ISP to sense a user input together with the first sensing electrode IE1 of the sensing layer SSL.

Figure 10A:
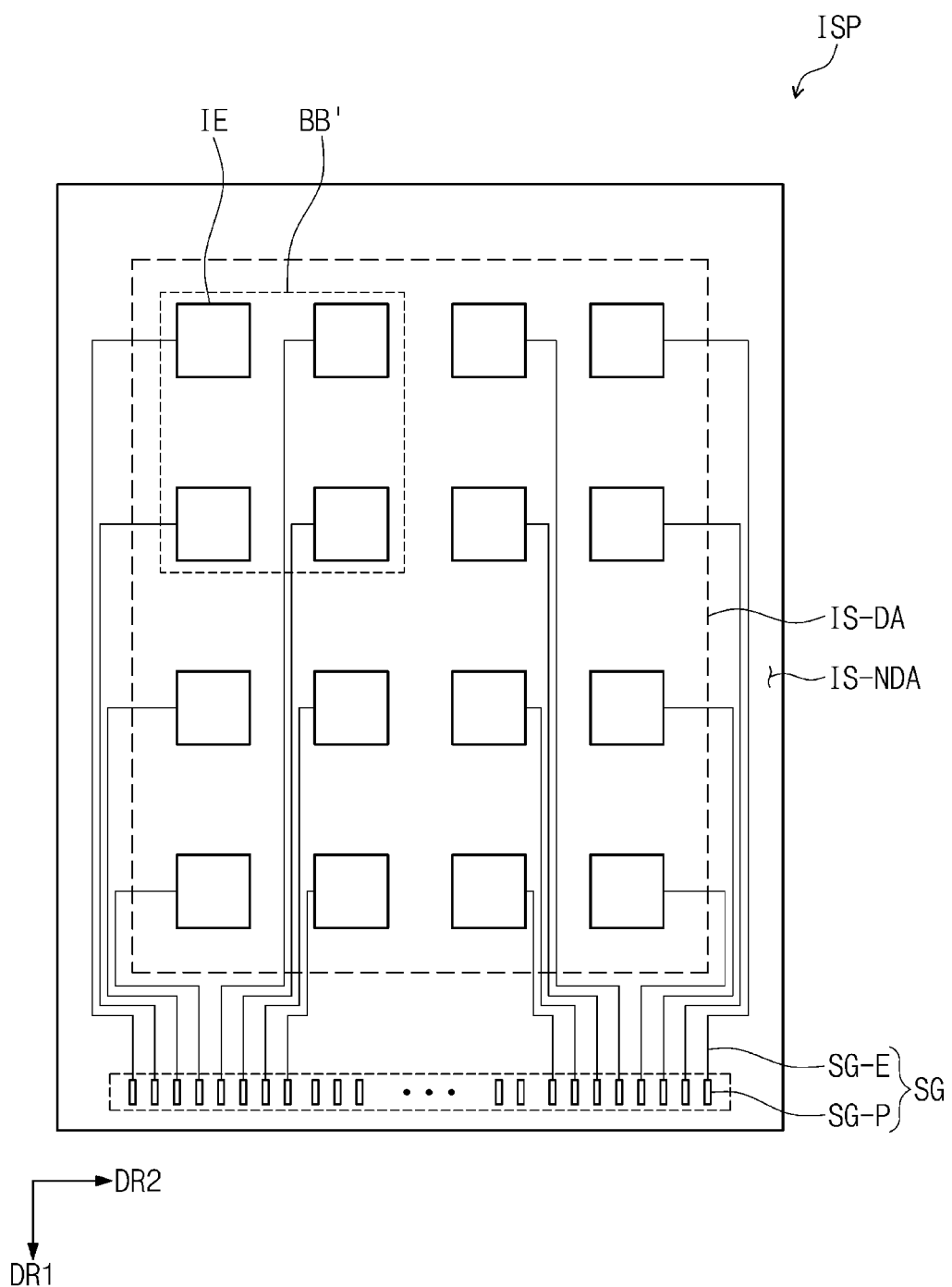
FIG. 10A is a plan view of an input sensor according to an embodiment of the present disclosure.
Figure 10B:
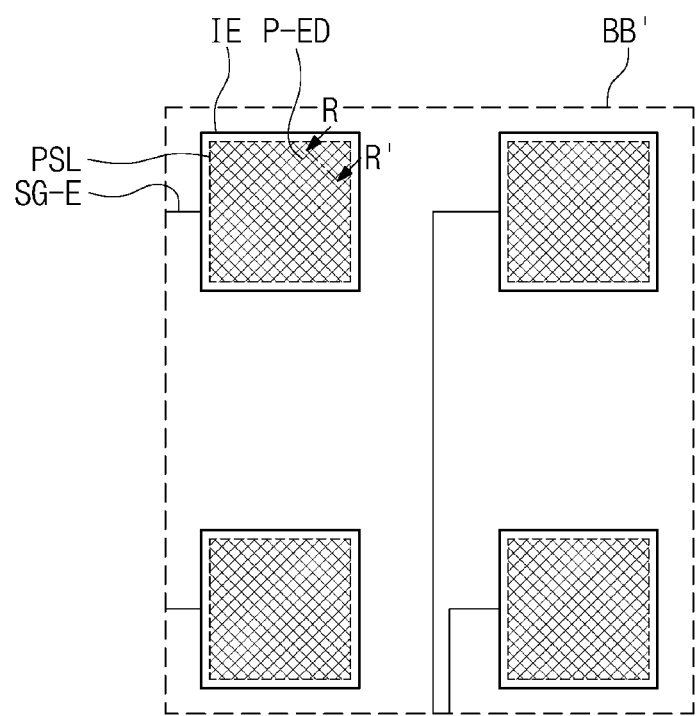
FIG. 10B is an enlarged view illustrating area BB' of FIG. 10A.
Figure 10C:
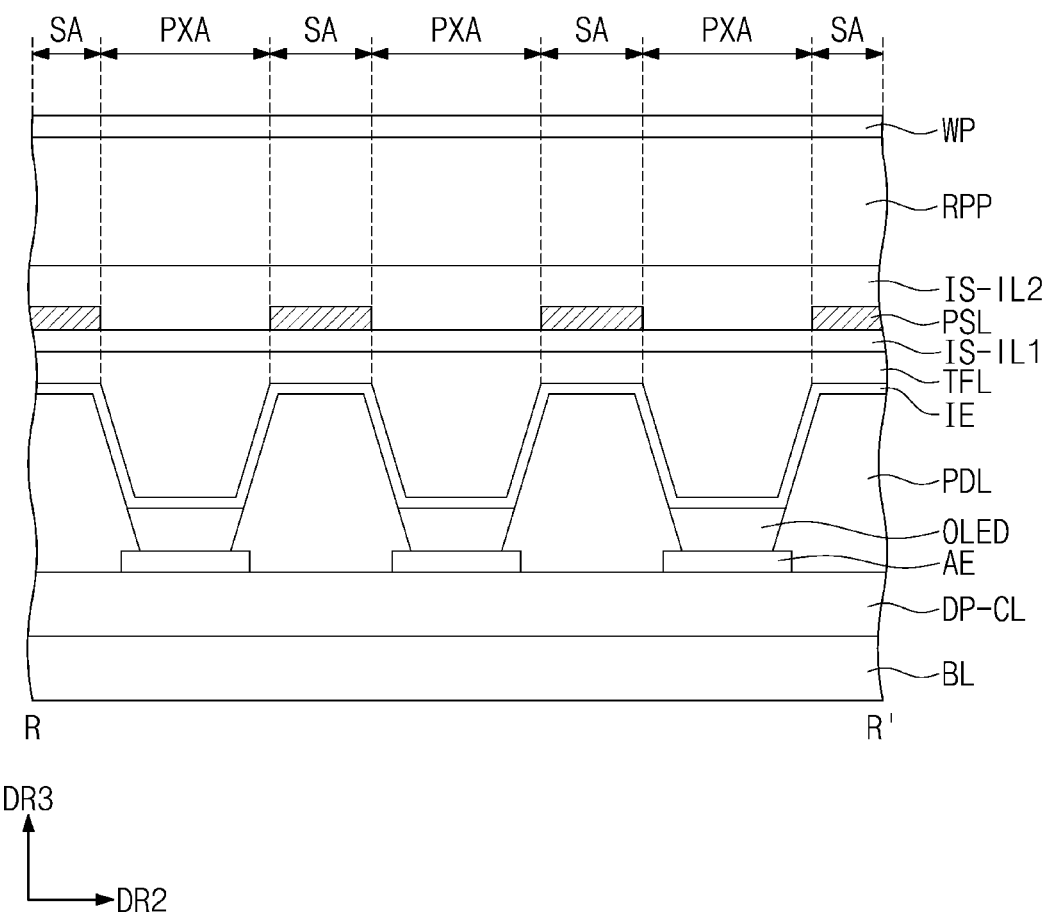
FIG. 10C is a sectional view taken along line R-R' in FIG. 10B.

FIG. 10A is a plan view of an input sensor according to an embodiment of the present disclosure. FIG. 10B is an enlarged view illustrating area BB' of FIG. 10A. FIG. 10C is a sectional view taken along line R-R' in FIG. 10B.

FIG. 10A is a plan view illustrating a self-cap type input sensor including a plurality of independent sensing electrodes. The plurality of sensing electrodes IE may be connected to a plurality of signal line groups SG, respectively. Although not illustrated, each of the plurality of sensing electrodes IE may have a mesh structure.

The plurality of signal line groups SG may include signal lines SG-E and pads SG-P connected to the plurality of sensing electrodes IE, respectively.

Referring to FIGS. 10A to 10C, the input sensor may include a sensing layer and a pressure sensor layer.

The sensing layer may include the plurality of sensing electrodes IE. The sensing layer may be disposed on the display element layer DP-OLED (refer to FIG. 6). Specifically, the sensing layer may be disposed on the emissive layer OLED and the pixel defining film PDL. The plurality of sensing electrodes IE of the sensing layer may be disposed on the emissive layer OLED and may serve as cathode electrodes. The plurality of sensing electrodes IE may operate in a time-division manner. The plurality of electrodes IE may constitute the input sensor that senses a user's input by a self-cap method.

In FIG. 10B, the pressure sensor layer PSL may be disposed on the plurality of sensing electrodes IE of the sensing layer. The pressure sensor layer PSL may include a plurality of electrodes P-ED. The pressure sensor layer PSL may have a mesh structure.

In FIG. 10C, a thin-film encapsulation layer TFL may be disposed between the pressure sensor layer PSL and the plurality of sensing electrodes IE. The pressure sensor layer PSL may be disposed on a first insulating layer IS-ILE A second insulating layer IS-IL2 may cover the pressure sensor layer PSL. A window WP may be disposed over the second insulating layer IS-IL2. An anti-reflection panel RPP may be disposed between the window WP and the second insulating layer IS-IL2, but the anti-reflection panel RPP may be omitted. The window WP may include a thin glass film having a thickness of 20 μm to 100 μm.

The plurality of sensing electrodes IE may be formed by patterning cathode electrodes.

Figure 11A:
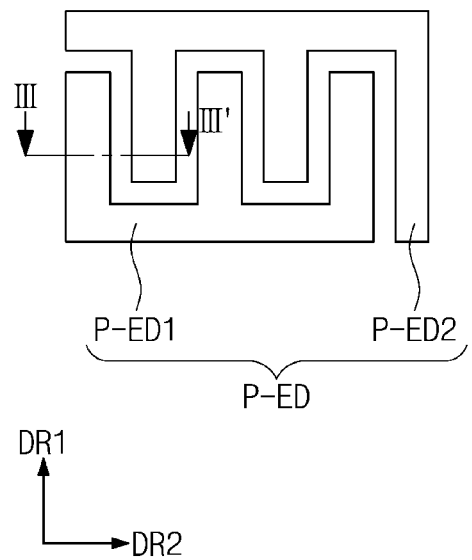
FIG. 11A is an enlarged view illustrating a pressure sensor layer of FIG. 10B.
Figure 11B:
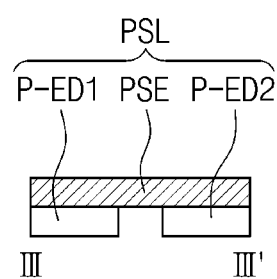
FIG. 11B is a sectional view taken along line in FIG. 11A.
Figure 11B:
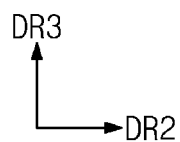

FIG. 11A is an enlarged view illustrating the pressure sensor layer of FIG. 10B. FIG. 11B is a sectional view taken along line in FIG. 11A. FIG. 12 is a sectional view of a pressure sensor layer according to an embodiment of the present disclosure.

In FIGS. 11A and 11B, the pressure sensor layer PSL may include a first conductive layer P-ED and a pressure sensor electrode PSE.

The first conductive layer P-ED may include a first electrode P-ED1 and a second electrode P-ED2. The first electrode P-ED1 and the second electrode P-ED2 may have an interdigitated configuration. The first electrode P-ED1 and the second electrode P-ED2 may be disposed to be engaged with each other. The first electrode P-ED1 and the second electrode P-ED2 may be disposed in the same layer.

The pressure sensor electrode PSE may be disposed on the first conductive layer P-ED. That is, the pressure sensor electrode PSE may be disposed on the first electrode P-ED1 and the second electrode P-ED2.

FIG. 12 is a sectional view of a pressure sensor layer according to an embodiment of the present disclosure.

The pressure sensor layer PSL may include a first electrode P-ED1, a second electrode P-ED2, and a pressure sensor electrode PSE. In this embodiment, the pressure sensor electrode PSE may include a plurality of nano-particles NP. The nano-particles NP may be surrounded by the first electrode P-ED1 and the second electrode P-ED2. The nano-particles NP may be disposed between the first electrode P-ED1 and the second electrode P-ED2.

The display device according to the embodiment of the present disclosure may accurately sense an input of a user based on the pressure of a touch of the user.

The display device according to the embodiment of the present disclosure may accurately provide an input by sensing the pressure of a user's touch when the user touches a virtual keyboard or a touch pad on the display surface.

As described above, the embodiments are disclosed in the drawings and the specification. Here, the terminology used herein is for the purpose of describing particular embodiments only and is not intended to limit the present disclosure. Therefore, those skilled in the art will appreciate that various modifications and other equivalent embodiments are possible. The scope of the present disclosure will be defined by the scope of the appended claims and their equivalents.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
   a display panel configured to display an image on a display surface; and
   an input sensor having a sensor area and a dummy area, wherein the input sensor includes:
   a first conductive layer disposed on the display panel, the first conductive layer including a first dummy electrode disposed in the sensor area and the dummy area;
   a second conductive layer disposed on the first conductive layer, the second conductive layer including a sensor electrode disposed in the sensor area and a second dummy electrode disposed in the dummy area; and
   a pressure sensor electrode disposed between the first conductive layer and the second conductive layer, and disposed between the first dummy electrode and the second dummy electrode to overlap the first dummy electrode and the second dummy electrode in a plan view.

2. The display device of claim 1, further comprising:
   a window disposed on the input sensor,
   wherein the window includes a thin glass film having a thickness of 20 μt to 100 μm.

3. The display device of claim 1, wherein the display surface includes a plurality of input sections spaced apart from each other, and
   wherein the pressure sensor electrode overlaps one of the plurality of input sections.

4. The display device of claim 3, wherein a non-input section is disposed between input sections disposed adjacent to each other, and
   wherein the pressure sensor electrode does not overlap the non-input section.

5. The display device of claim 1, wherein the sensor electrode includes a first sensing electrode extending in a first direction and a second sensing electrode extending in a second direction crossing the first direction, and
   wherein the dummy area is disposed between the first sensing electrode and the second sensing electrode in a plan view.

6. The display device of claim 5, wherein the first sensing electrode includes a plurality of first electrodes and the second sensing electrode includes a plurality of second electrodes, and
   wherein each of the plurality of first electrodes and each of the plurality of second electrodes includes an open area which is the dummy area.

7. The display device of claim 1, wherein the pressure sensor electrode has a mesh structure.

8. The display device of claim 1, further comprising:
   an encapsulation layer disposed between the display panel and the input sensor,
   wherein the input sensor includes:
   a first insulating layer disposed on the encapsulation layer;
   a second insulating layer disposed on the first insulating layer; and
   a third insulating layer disposed on the second insulating layer.

9. The display device of claim 8, wherein the first conductive layer is disposed on the first insulating layer,
   wherein the second conductive layer is disposed on the second insulating layer, and
   wherein the pressure sensor electrode is disposed between the first conductive layer and the second conductive layer.

10. The display device of claim 1, wherein the pressure sensor electrode includes a plurality of nano-particles.

11. A display device comprising:
    a base layer;
    a circuit layer disposed on the base layer;
    a display element layer disposed on the circuit layer;
    a sensing layer disposed on the display element layer, the sensing layer including a sensing pattern, and
    a pressure sensor layer disposed on the sensing layer,
    wherein the display element layer includes a first electrode connected to the circuit layer, an emissive layer disposed on the first electrode, and a second electrode disposed on the emissive layer,
    wherein the second electrode has the same pattern as the sensing pattern, and
    wherein the pressure sensor layer includes a first pressure sensing pattern disposed on the same layer as the sensing pattern and a second pressure sensing pattern disposed on the same layer as the sensing pattern.

12. The display device of claim 11, further comprising:
    an encapsulation layer disposed between the second electrode and the sensing pattern.

13. The display device of claim 11, wherein the pressure sensor layer further includes a pressure sensor electrode disposed on the first pressure sensing pattern and the second pressure sensing pattern.

14. The display device of claim 13, further comprising:
    an input sensor,
    wherein the input sensor includes the sensing layer, the pressure sensor layer, and the second electrode.

15. The display device of claim 11, wherein the first pressure sensing pattern and the second pressure sensing pattern have an interdigitated configuration.

16. The display device of claim 11, further comprising:
    a window disposed on the sensing layer,
    wherein the window includes a thin glass film having a thickness of 20 μm to 100 μm.

17. A display device comprising:
    a base layer;
    a circuit layer disposed on the base layer;
    an emissive layer disposed on the circuit layer;
    a sensing layer disposed on the emissive layer; and
    a pressure sensor layer disposed on the sensing layer,
    wherein the sensing layer includes a plurality of sensing electrodes, wherein the pressure sensor layer includes a first conductive layer and a second conductive layer disposed on the first conductive layer, wherein the first conductive layer includes a first electrode and a second electrode have an interdigitated configuration, wherein the second conductive layer includes a pressure sensor electrode covering the first electrode and the second electrode, and wherein the first electrode and the second electrode are disposed on the same layer as the sensing pattern.

18. A display device comprising:

a base layer;

a circuit layer disposed on the base layer;

an emissive layer disposed on the circuit layer;

a sensing layer disposed on the emissive layer; and a pressure sensor layer disposed on the sensing layer, wherein the sensing layer includes a plurality of sensing electrodes, wherein the pressure sensor layer includes a first conductive layer and a second conductive layer disposed on the first conductive layer, wherein the first conductive layer includes a first electrode and a second electrode disposed on the first electrode, and wherein the second conductive layer includes a pressure sensor electrode disposed between the first electrode and the second electrode.

* * * * *